United States Patent
Nakanotani et al.

(10) Patent No.: US 10,230,064 B2
(45) Date of Patent: Mar. 12, 2019

(54) ORGANIC LIGHT-EMITTING DEVICE

(71) Applicant: KYUSHU UNIVERSITY, NATIONAL UNIVERSITY CORPORATION, Fukuoka-shi, Fukuoka (JP)

(72) Inventors: Hajime Nakanotani, Fukuoka (JP); Chihaya Adachi, Fukuoka (JP); Takahiro Higuchi, Fukuoka (JP)

(73) Assignee: KYUSHU UNIVERSITY, NATIONAL UNIVERSITY CORPORATION, Fukuoka-Shi, Fukuoka (JP)

( * ) Notice: Subject to any disclaimer, the term of this patent is extended or adjusted under 35 U.S.C. 154(b) by 108 days.

(21) Appl. No.: 15/523,569

(22) PCT Filed: Oct. 30, 2015

(86) PCT No.: PCT/JP2015/080670
§ 371 (c)(1),
(2) Date: May 1, 2017

(87) PCT Pub. No.: WO2016/068277
PCT Pub. Date: May 6, 2016

(65) Prior Publication Data
US 2017/0309857 A1    Oct. 26, 2017

(30) Foreign Application Priority Data

Oct. 31, 2014 (JP) ................ 2014-223327

(51) Int. Cl.
*H01L 51/50* (2006.01)
*H05B 33/22* (2006.01)
(Continued)

(52) U.S. Cl.
CPC ......... *H01L 51/5036* (2013.01); *C09K 11/06* (2013.01); *H01L 51/50* (2013.01);
(Continued)

(58) Field of Classification Search
CPC ............ H01L 51/5036; H01L 51/5044; H01L 51/5024
See application file for complete search history.

(56) References Cited

U.S. PATENT DOCUMENTS 7,928,650 B2 * 4/2011 Mori ................... H01L 27/3211
313/113
2009/0033212 A1    2/2009 Ahn et al.
(Continued)

FOREIGN PATENT DOCUMENTS

| CN | 101682000 A | 3/2010 |
| CN | 101728490 A | 6/2010 |

(Continued)

OTHER PUBLICATIONS

International Preliminary Report on Patentability for corresponding PCT International Application No. PCT/JP2015/080670, dated May 11, 2017, with English translation.
(Continued)

*Primary Examiner* — Joseph L Williams
(74) *Attorney, Agent, or Firm* — Browdy and Neimark, PLLC

(57) ABSTRACT

An organic light-emitting device having a layer 10 containing a delayed blue fluorescent material, a layer 11 containing separately or together a green fluorescent material and a red fluorescent material, and a spacer layer 12 arranged between the layer 10 and the layer 11 can efficiently emit white color.

15 Claims, 4 Drawing Sheets

(51) Int. Cl.
*C09K 11/06* (2006.01)
*H05B 33/14* (2006.01)

(52) U.S. Cl.
CPC ...... *H01L 51/5024* (2013.01); *H01L 51/5044* (2013.01); *H05B 33/14* (2013.01); *H05B 33/22* (2013.01); *H01L 51/5056* (2013.01)

(56) References Cited

U.S. PATENT DOCUMENTS

| | | | | |
|---|---|---|---|---|
| 2010/0090238 | A1* | 4/2010 | Mori | H01L 51/5016 257/98 |
| 2010/0090592 | A1* | 4/2010 | Shiobara | H01L 27/3211 313/504 |
| 2010/0090593 | A1* | 4/2010 | Mori | H01L 27/3211 313/504 |
| 2014/0034930 | A1* | 2/2014 | Seo | H01L 51/5016 257/40 |
| 2016/0329512 | A1* | 11/2016 | Nishide | H01L 51/5028 |
| 2018/0047927 | A1* | 2/2018 | Zhang | G09G 3/12 |

FOREIGN PATENT DOCUMENTS

| | | |
|---|---|---|
| EP | 2175503 A2 | 4/2010 |
| JP | 2010-114070 A1 | 5/2010 |
| JP | 2010-161071 A1 | 7/2010 |
| JP | 2010-527108 A | 8/2010 |
| JP | 2014-096557 A | 5/2014 |
| WO | 2008-140675 A1 | 11/2008 |
| WO | 2008140675 A1 | 11/2008 |
| WO | 2014-157619 A1 | 10/2014 |

OTHER PUBLICATIONS

International Search Report and Search Opinion for corresponding PCT International Application No. PCT/JP2015/080670.
Reineke et al., White organic light-emitting diodes with fluorescent tube efficiency, Nature, 459:234-239 (2009).
Office Action dated May 3, 2018, issued in corresponding Chinese patent application No. 201580058151.5, with English Machine Translation.
Extended European Search Report dated May 14, 2018, issued in corresponding European patent application No. 15855365.1.

* cited by examiner

E1: Example 1, E2: Example 2, CE1: Comparative Example 1
CE2: Comparative Example 2

ORGANIC LIGHT-EMITTING DEVICE

TECHNICAL FIELD

The present invention relates to an organic light-emitting device that can efficiently emit white color.

BACKGROUND ART

In the field of an organic light-emitting device such as an organic electroluminescent device (organic EL device) or the like, developments are being carried out for the purpose of attaining high emission efficiency for each of blue emission, green emission and red emission. Further, also for an organic light-emitting device constructed to emit white color by combining these emission colors (organic white light-emitting diode), investigations relating to combination and layer configuration of light-emitting materials that can realize high emission efficiency are being promoted.

For example, NPL 1 describes insertion of spacer layers between plural phosphorescent material-containing layers in a system using a phosphorescent material. The literature discloses, as an example thereof, an organic light-emitting device having a layer containing a blue phosphorescent material, a mixed layer containing a green phosphorescent material and a red phosphorescent material mixed therein, and a spacer layer existing between these layers. When a blue phosphorescent material, a green phosphorescent material and a red phosphorescent material are mixed to exist in one and the same layer, energy transfer from the high-energy blue phosphorescent material to the green phosphorescent material and further from the green phosphorescent material to the red phosphorescent material is easy, and therefore, for realizing well-balanced emission from every phosphorescent material, precise density control is needed. Contrary to this, when the blue phosphorescent material, the green phosphorescent material and the red phosphorescent material are separated from each other via a spacer layer therebetween, energy transfer from the blue phosphorescent material to the other phosphorescent materials can be prevented by the spacer layer and therefore it is said that well-balanced emission from each phosphorescent material would be realized.

CITATION LIST

Non-Patent Literature

NPL 1: Nature 459, 234-238 (2009).

SUMMARY OF INVENTION

Technical Problem

However, in a system using a phosphorescent material like the organic light-emitting device of NPL 1, there may occur a roll-off phenomenon that the emission efficiency suddenly lowers owing to triplet-triplet annihilation to occur with the increase in current density, or a phenomenon that the emitted color may concentrate in any limited hue, and consequently, there is a problem that it is difficult to increase white emission intensity by increasing a current density. In addition, a phosphorescent material contains a rare element such as Ir or the like and is expensive, and in particular, a high-energy blue phosphorescent material has a drawback in that its stability is low.

Consequently, the present invention is addressed to a technical problem to provide a light-emitting device that is free from any excessive emission efficiency reduction owing to triplet-triplet annihilation and can emit white color efficiently.

Solution to Problem

The present inventors have investigated fluorescent materials to efficiently emit white color. In general, for energy transfer from a blue phosphorescent material to a green fluorescent material and a red fluorescent material, the distance between the blue phosphorescent material and each fluorescent material must be short (0.3 to 1 nm or so). Accordingly, in the configuration of arranging a mixed layer of a green fluorescent material and a red fluorescent material in place of the above-mentioned mixed layer of a green phosphorescent material and a red phosphorescent material, it is presumed that energy transfer from the blue phosphorescent material to each fluorescent material would be greatly restricted by the spacer layer, and consequently, the configuration of the type is not generally employed in consideration of the balance of emitted colors. On the other hand, it is known that the efficiency of energy transfer from a fluorescent material to a fluorescent material is extremely poor. Consequently, a system where all the blue phosphorescent material, the green phosphorescent material and the red phosphorescent material are converted to fluorescent materials is also a system that is generally not employed for the same reasons. In fact, an organic light-emitting device having a fluorescent material system where a spacer layer is arranged between light-emitting layers has not been proposed up to now, and there is no literature at all that suggests such light-emitting layers of a fluorescent material system.

Given the situation, the present inventors have further promoted assiduous investigations relating to an organic light-emitting device with a fluorescent material system where a spacer layer is arranged between light-emitting layers, intending to make the organic light-emitting device emit white color more efficiently.

As a result of assiduous investigations, the present inventors have found that, (1) when a delayed fluorescent material is selected as a blue fluorescent material having a shortest wavelength, and further (2) when a spacer layer is arranged between a layer containing the delayed fluorescent material and a layer containing individually or together a green fluorescent material and a red fluorescent material, a high-efficiency organic white light-emitting device can be provided. In consideration of the energy transfer efficiency from a fluorescent material to a fluorescent material as above, the fact that, by arranging a spacer layer between light-emitting layers of a fluorescent material system, the light emission efficiency can be improved is an unexpected finding. Based on these findings, the present inventors have reached providing the present invention described below, as a means for solving the above-mentioned problems.

[1] An organic light-emitting device having a layer containing a delayed blue fluorescent material, a layer containing separately or together a green fluorescent material and a red fluorescent material, and a spacer layer arranged between the layer containing a delayed blue fluorescent material and the layer containing separately or together a green fluorescent material and a red fluorescent material.

[2] The organic light-emitting device according to [1], wherein the layer containing a delayed blue fluorescent material further contains a host material.

[3] The organic light-emitting device according to [1] or [2], wherein in the layer containing separately or together a green fluorescent material and a red fluorescent material, the green fluorescent material and the red fluorescent aterial exist in one and the same layer as mixed therein.

[4] The organic light-emitting device according to [1] or [2], wherein in the layer containing separately or together a green fluorescent material and a red fluorescent material, the green fluorescent material and the red fluorescent material are contained separately in different layers.

[5] The organic light-emitting device according to [4], wherein the layer containing a green fluorescent material and the layer containing a red fluorescent material are arranged continuously.

[6] The organic light-emitting device according to [4] or [5], wherein the layer containing a green fluorescent material is arranged closer to the side of the spacer layer than to the side of the layer containing a red fluorescent material.

[7] The organic light-emitting device according to any one of [1] to [6], wherein regarding the weight of each fluorescent material in the layer containing separately or together a green fluorescent material and a red fluorescent material, the weight of the green fluorescent material is larger than that of the red fluorescent material.

[8] The organic light-emitting device according to [7], wherein in the layer containing separately or together a green fluorescent material and a red fluorescent material, the molar ratio of the red fluorescent material to the green fluorescent material (weight of red fluorescent material/ weight of green fluorescent material) is ½ to 1/100.

[9] The organic light-emitting device according to any one of [1] to [8], wherein the layer containing separately or together a green fluorescent material and a red fluorescent material further contains a host material.

[10] The organic light-emitting device according to any one of [1] to [9], wherein the thickness of the spacer layer is 0.5 to 10 nm.

[11] The organic light-emitting device according to any one of [1] to [10], wherein the lowest excited singlet energy level and the lowest excited triplet energy level of the material of the spacer layer each are larger than the lowest excited singlet energy level and the lowest excited triplet energy level, respectively, of the delayed blue fluorescent material.

[12] The organic light-emitting device according to any one of [9] to [11], wherein the spacer layer contains the same host material as the host material contained in the layer containing separately or together a green fluorescent material and a red fluorescent material.

[13] The organic light-emitting device according to any one of [1] to [12], which is an organic electroluminescent device.

[14] The organic light-emitting device according to [13], which has an anode, a cathode and, as arranged between the anode and the cathode, an organic layer containing a light-emitting layer, and wherein the light-emitting layer has a layer containing a delayed blue fluorescent material, a layer containing separately or together a green fluorescent material and a red fluorescent material, and a spacer layer arranged between the layer containing a delayed blue fluorescent material and the layer containing separately or together a green fluorescent material and a red fluorescent material.

[15] The organic light-emitting device according to [14], wherein the layer containing a delayed blue fluorescent material is arranged on the cathode side and the layer containing separately or together a green fluorescent material and a red fluorescent material is arranged on the anode side.

Advantageous Effects of Invention

The present invention can realize an organic light-emitting device capable of efficiently emitting a white color by arranging a spacer layer between the layer containing a delayed blue fluorescent material and the layer containing separately or together a green fluorescent material and a red fluorescent material therein.

DESCRIPTION OF EMBODIMENTS

The contents of the present invention are described in detail hereinunder. The constitutional elements may be described below with reference to representative embodiments and specific examples of the invention, but the invention is not limited to the embodiments and the examples. In this description, the numerical range expressed by the wording "a number to another number" means the range that falls between the former number indicating the lower limit of the range and the latter number indicating the upper limit thereof. In the invention, the hydrogen atom that is present in the molecule of the compound used in the invention is not particularly limited in isotope species, and for example, all the hydrogen atoms in the molecule may be $^1H$, and all or a part of them may be $^2H$ (deuterium D).

<Organic Light-Emitting Device>

The organic light-emitting device of the present invention has a layer containing a delayed blue fluorescent material, a layer containing separately or together a green fluorescent material and a red fluorescent material, and a spacer layer arranged between the layer containing a delayed blue fluorescent material and the layer containing separately or together a green fluorescent material and a red fluorescent material.

In the present invention, the "delayed blue fluorescent material" means an organic compound that is capable of being transferred to the triplet excited state and then undergoing reverse intersystem crossing to the singlet excited state, and emits blue fluorescence on returning from the singlet excited state to the ground state. The light formed through the reverse intersystem crossing from the triplet excited state to the singlet excited state has a lifetime that is longer than normal fluorescent light (prompt fluorescent light phosphorescence), and thus is observed as fluorescent light that is delayed therefrom.

The "spacer layer" is a layer that functions as a barrier to prevent carrier transfer from the delayed blue fluorescent material-containing layer to the green/red fluorescent material-containing layer.

In the following description, the layer containing a delayed blue fluorescent material may be referred to as a "delayed blue fluorescent material-containing layer", and the layer containing separately or together a green fluorescent material and a red fluorescent material may be referred to as a "green/red fluorescent material-containing layer".

The organic light-emitting device having the configuration as above can efficiently emit white color. This is presumed to be because of the following mechanism.

Figure 1:
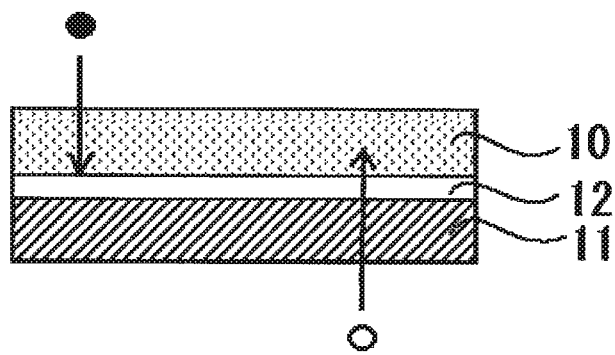
FIG. 1 This is a main section of an organic light-emitting device.

FIG. 1 schematically shows a main section of the organic light-emitting device of the present invention.

As shown in FIG. 1, in the organic light-emitting device having a delayed blue fluorescent material-containing layer 10, a green/red fluorescent material-containing layer 11, and a spacer layer 12 arranged between the delayed blue fluorescent material-containing layer 10 and the green/red fluorescent material-containing layer 11, when carriers that are opposite to each other are injected into the delayed blue fluorescent material-containing layer 10 and the green/red fluorescent material-containing layer 11, the carriers injected into the green/red fluorescent material-containing layer 11 transfer to the delayed blue fluorescent material-containing layer 10 from the green/red fluorescent material-containing layer 11 after having passed through the spacer layer 12. On the other hand, the carriers injected into the delayed blue fluorescent material-containing layer 10 are prevented from transferring into the green/red fluorescent material-containing layer 11 by the spacer layer 12 acting as a barrier, and therefore, almost all of them remain inside the delayed blue fluorescent material-containing layer 10 and the interface between the delayed blue fluorescent material-containing layer 10 and the spacer layer 12, and recombine with the carriers having transferred from the green/red fluorescent material-containing layer 11 to generate energy. By this energy, the delayed blue fluorescent material is excited to be in an excited singlet state and an excited triplet state, and among these, the excitons excited in an excited triplet state are transferred to be in an excited single state through reverse intersystem crossing. A part of the thus-generated, excited singlet energy of the delayed blue fluorescent material transfers to the green fluorescent material and the red fluorescent material in the green/red fluorescent material-containing layer to thereby excite each of these fluorescent materials to be in an excited single state. With that, the remaining singlet excitons of the delayed blue fluorescent material, the singlet excitons of the green fluorescent material and the singlet excitons of the red fluorescent material are to return to the ground state thereof while emitting blue light, green light and red light, respectively. Accordingly, the blue light, the green light and the red light are combined to give white light.

Here, a case is presumed where the organic light-emitting device does not have a spacer layer and where the light-emitting layer in the device contains a delayed, blue fluorescent material mixed with a green fluorescent material and a red fluorescent material. In this case, it is considered that the carriers injected into the light-emitting layer would be preferentially trapped by the green fluorescent material and the red fluorescent material rather than by the delayed blue fluorescent material, and are directly recombined on each of the fluorescent materials to excite the fluorescent materials. In this case, the lowest excited singlet energy level $S_1$ and the lowest excited triplet energy level $T_1$ of the green fluorescent material and the red fluorescent material are lower than the lowest excited singlet energy level $S_1$ and the lowest excited triplet energy level $T_1$ of the Delayed blue fluorescent material, and therefore, the energy generated by the green fluorescent material and the red fluorescent material does not transfer to the delayed blue fluorescent material with the result that little emission is given by the delayed blue fluorescent material. In addition, ordinary fluorescent materials (green fluorescent material, red fluorescent material) do not undergo reverse intersystem crossing, and therefore in these, the triplet excitons that account for 75% of the excitons therein deactivate without radiation, and only the singlet excitons whose formation possibility is 25% could act to give emission. In addition, it is considered that, even though carriers could be recombined on the delayed blue fluorescent material to form excitons, the resultant energy would readily transfer to the green fluorescent material and the red fluorescent material before used for blue emission. Consequently, the emission to be obtained lacks blue, and the emission efficiency is low.

As opposed to this, in the organic light-emitting device of the present invention, the delayed blue fluorescent material-containing layer 10, and the green/red fluorescent material-containing layer 11 containing a green fluorescent material and a red fluorescent material are separated from each other via the spacer layer 12, and therefore carriers are preferentially recombined on the delayed blue fluorescent material to form excitons, and the energy of the triplet excitons can be made to effectively contribute toward blue fluorescent emission via reverse intersystem crossing. In addition, the excited singlet energy generated in the delayed blue fluorescent material may transfer relatively easily to each of the other fluorescent materials and by this energy, the green fluorescent material and the red fluorescent material can emit light in a well-balanced manner with the delayed blue fluorescent material. It may be presumed that, according to the mechanism mentioned hereinabove, the organic light-emitting device could efficiently emit white color.

Further, the organic light-emitting device of the present invention have other advantageous characteristics in that it can provide an emission spectrum of the same pattern irrespective of current density, and even in long-term use, the color purity changes little, and therefore by increasing current density, the emission intensity can be increased without detracting from whiteness, and in addition, the organic light-emitting device can emit white color stably for a long period of time.

The configuration of each layer constituting the organic light-emitting device is described in detail hereinunder.

[Delayed Blue Fluorescent Material-Containing Layer]

The delayed blue fluorescent material-containing layer is a layer in which the carrier injected thereinto are recombined with the carriers having transferred from the green/red fluorescent material-containing layer via the spacer layer are recombined to form excitons, and thus the delayed blue fluorescent material-containing layer emits blue light. Here, in the delayed blue fluorescent material, the triplet excitons also change to singlet excitons via reverse intersystem crossing, and therefore along with the singlet excitons directly formed by carrier recombination, the energy of the triplet excitons can be made to indirectly contribute toward fluorescent emission.

The delayed blue fluorescent material-containing layer may be composed of a delayed blue fluorescent material alone or may contain a delayed blue fluorescent material and a host material. However, the delayed blue fluorescent material-containing layer does not contain ordinary fluorescent materials (for example, blue, green, red fluorescent materials). When the delayed blue fluorescent material-containing layer contains any ordinary fluorescent material, the triplet excitons firmed by carrier recombination on the fluorescent material could not be made to efficiently contribute toward light emission, and the emission efficiency may lower.

Though not specifically limited, the delayed blue fluorescent material is preferably a delayed fluorescent material having high durability.

Preferably, the delayed blue fluorescent material has an emission peak within a range of 400 to 520 nm, more preferably an emission peak within a range of 420 to 500 nm, even more preferably an emission peak within a range of 460 to 470 nm.

The delayed blue fluorescent material is preferably such that the difference between the lowest excited singlet energy level $S_1$ and the lowest triplet excite energy level $T_1$ thereof, $\Delta E_{st}$ is 0.20 eV or less, more preferably 0.15 eV or less, even more preferably 0.10 eV or less.

Specific examples of the delayed blue fluorescent material usable in the present invention are exemplified below. However, the delayed blue fluorescent material usable in the present invention should not be limitatively interpreted by these exemplifications.

4,5-bis(carbazol-9-yl)-1,2-dicyanobenzene (2CzPN)
2,4-bis-(9H-carbazol-9-yl)-9H-carbazol-9-yl-6-phenyl-1,3,5-triazine (CC2TA)
10-phenyl-10H-10'H-spiro[acridine-9-9'-antracen]-10'-one (ACRSA)
bis[4-(9,9-dimethyl-9,10-dihydroacridine)phenyl]sulfone (DMACDPS)

In the case where a host material is used, the host material is preferably an organic compound whose lowest excited triplet energy level $T_1$ is higher than that of the delayed blue fluorescent material. With that, the triplet excitons formed in the delayed blue fluorescent material can be trapped in the molecules of the delayed blue fluorescent material, thereby promoting reverse intersystem crossing from the excited triplet state to an excited single state. In addition, the lowest excited singlet energy level $S_1$ of the host material is preferably selected in consideration of satisfying both radiation deactivation from the excited singlet state to the ground state on the delayed blue fluorescent material and transfer of the excited singlet energy toward the green/red fluorescent material-containing layer. From these viewpoints, the lowest excited singlet energy level $S_1$ of the host material is preferably $S_{b1}+0.1$ eV or more where $S_{b1}$ means the lowest excited single energy level of the delayed blue fluorescent material, more preferably $S_{b1}+0.2$ eV or more, even more preferably $S_{b1}+0.3$ eV or more.

In the case where a host material is used, the amount of the delayed blue fluorescent material to be contained in the delayed blue fluorescent material-containing layer is preferably 5 to 90% by weight, more preferably 75% by weight or less, even more preferably 50.0% by weight or less.

The host material in the delayed blue fluorescent material-containing layer is preferably an organic compound having a hole transport capability and an electron transport capability, capable of preventing prolongation of emission wavelength, and having a high glass transition temperature.

[Green/Red Fluorescent Material-Containing Layer]

The green/red fluorescent material-containing layer is a layer in which excitons are formed by the energy transferred from the delayed blue fluorescent material-containing layer via the spacer layer, and which thereafter emits green light and red light. In the organic light-emitting device, the blue light from the delayed blue fluorescent material-containing layer is combined with the green light and the red light from the green/red fluorescent material-containing layer to give white light.

The green/red fluorescent material-containing layer contains a green fluorescent material and a red fluorescent material. The green fluorescent material and the red fluorescent material may exist as combined in one and the same layer, or may be separately contained in different layers.

In the case where the green fluorescent material and the red fluorescent material are contained in different layers, preferably, the green fluorescent material-containing layer and the red fluorescent material-containing layer are continuously arranged. In that manner, the energy from the delayed blue fluorescent material can be efficiently transferred to each layer. Any of the green fluorescent material-containing layer and the red fluorescent material-containing layer may be arranged on the side of the spacer layer, but preferably, the green fluorescent material-containing layer is arranged closer to the spacer side than the red fluorescent material-containing layer. With that, the energy from the delayed blue fluorescent material-containing layer can be efficiently transferred to both the green fluorescent material-containing layer and the red fluorescent material-containing layer.

Preferably, the green fluorescent material has an emission peak within a range of 500 to 560 nm, more preferably an emission peak within a range of 510 to 550 nm, even more preferably an emission peak within a range of 520 to 540 nm.

Specific examples of the green fluorescent material usable in the present invention are exemplified below. However, the green fluorescent material usable in the present invention should not be limitatively interpreted by these exemplifications.

3-(2-Benzothiazolyl)-7-(diethylaminc)cournarin (Coumarin6)
2,3,6,7-tetrahydro-1,1,7,7,-tetramethyl-1H5H,11H-10-(2-benzothiazolyl)quinolizino[9, 9a,1gh]comarin (C545T)
N,N'-dimethyl-quinacridone (DMQA)
9,10-bis[N,N-di-(p-tolyl)-amino]anthracene (TTPA)

Preferably, the red fluorescent material has an emission peak within a range of 560 to 750 nm, more preferably an emission peak within a range of 570 to 680 nm, even more preferably an emission peak within a range of 580 to 650 nm.

Specific examples of the red fluorescent material usable in the present invention are exemplified below. However, the red fluorescent material usable in the present invention should not be limitatively interpreted by these exemplifications.

2,8-di-tert-butyl-5,11-bis(4-tert-butylphenyl)-6,12-diphenyltetracene (TBRb)
4-(dicyanomethylene)-2-tert-butyl-6-(1,1,7,7-tetramethyl-julolidine-4-yl-vinyl)-4H-pyran (DCJTB)
4-(dicyanomethylene)-2-methyl-6-julolidyl-9-enyl-4H-1-pyran (DCM2)
Dibenzo {[f,f']-4,4',7,7'-tetraphenyl}diindeno[1,2,3-cd:1',2'3'-lm]perylene (DBP)

Regarding the amount by weight of each fluorescent material in the green/red fluorescent material-containing layer, preferably, the amount of the green fluorescent material is larger than that of the red fluorescent material. Specifically, the molar ratio of the red fluorescent material to the green fluorescent material (weight of red fluorescent material/weight of green fluorescent material) is preferably ½ to 1/100, more preferably 1/10 to 1/70, even more preferably 1/20 to 1/40.

The layer containing a green fluorescent material and a red fluorescent material as mixed therein, the layer containing a green fluorescent material and the layer containing a red fluorescent material each may contain a blue fluorescent material (not a delayed blue fluorescent material but an ordinary blue fluorescent material), and may contain a host material.

Specific examples of preferred blue fluorescent materials that may be contained in the green/red fluorescent material-containing layer are shown below.

6-methyl-2-(4-(9-(4-(6-methylbenzo[d]thiazol-2-yl)anthracen-10-yl)phenyl)benzo[d]thiazole (DBzA)
2,5,8,11-tetra-tert-butylperylene (TBPe)
4-(di-p-tolylamino)-4'-[(di-p-tolylamno)styryl]stilbene (DPAVB)
4,4'-bis(carbazol-9-yl)triphenylamine (CBP)
2,2',2"-(1,3,5-Benzinetriyl)-tris(1-phenyl-1-H-benzimidazole) (TPBi)

In the case where a host material is used, the host material is preferably an organic compound of such that at least the lowest excited single energy level $S_1$ thereof is higher than any others of the fluorescent materials co-existing in one and the same layer, and is more preferably an organic compound of such that the lowest excited single energy level $S_1$ thereof and the lowest excited triplet energy level $T_1$ thereof are higher than any others of the fluorescent materials co-existing in one and the same layer. In that manner, the singlet excitons and the triplet excitons formed in each fluorescent material can be trapped in the molecules of each fluorescent material and the emission efficiency of each material can be fully increased. Needless-to-say, even though singlet excitons and triplet excitons could not be fully trapped, a high emission efficiency could be realized as the case may be, and therefore, any host material capable of realizing a high emission efficiency can be used in the present invention with no limitation.

In the case where a host material is used, the amount of the green fluorescent material to be contained in the green/red fluorescent material-containing layer is preferably 1 to 90% by weight, more preferably 5 to 50% by weight, even more preferably 10 to 20% by weight. In the case, the amount of the red fluorescent material to be contained in the green/red fluorescent material-containing layer is preferably 1 to 10% by weight, more preferably 1 to 5% by weight, even more preferably 1 to 3% by weight.

The host material in the green/red fluorescent material-containing layer is preferably an organic compound having a hole transport capability and an electron transport capability, capable of preventing prolongation of emission wavelength, and having a high glass transition temperature.

[Spacer Layer]

The spacer layer is a layer that functions as a barrier for preventing carrier transfer from the delayed blue fluorescent material-containing layer to the green/red fluorescent material-containing layer. With that, direct carrier recombination in the green/red fluorescent material-containing layer can be prevented, and the carriers can be preferentially recombined in the delayed blue fluorescent material-containing layer.

As the material of the spacer layer, one whose lowest excited singlet energy level $S_1$ and lowest excited triplet energy level $T_1$ are higher than those of the delayed blue fluorescent material is used. Specifically, the lowest excited singlet energy level $S_1$ of the material of the spacer layer is preferably $S_{b1}+0.5$ eV or more where the lowest excited singlet energy level of the delayed blue fluorescent material is represented by $S_{b1}$ (eV), more preferably $S_{b1}+0.5$ eV to $S_{b1}+1.0$ eV, even more preferably $S_{b1}+1.0$ eV to $S_{b1}+1.5$ eV. The lowest excited triplet energy level $T_1$ of the material of the spacer layer is preferably $T_{b1}+0.5$ eV or more where the lowest excited triplet energy level of the delayed blue fluorescent material is represented by $T_{b1}$ (eV), more preferably $T_{b1}+0.5$ eV to $T_{b1}+1.0$ eV, even more preferably $T_{b1}+1.0$ eV to $T_{b1}+1.5$ eV.

For use as the material of the space layer, one whose lowest excited singlet energy level $S_1$ and lowest excited triplet energy level $T_1$ are higher than those of the delayed blue fluorescent material may be selected from materials usable as ordinary host materials, and in particular, the host material preferably contains the same host material as that used in the green/red fluorescent material-containing layer.

Though not specifically limited, the thickness of the spacer layer is preferably 0.5 to 10 nm, and the lower limit thereof is preferably 0.9 nm or more, more preferably 1.5 nm or more. The upper limit of the thickness of the spacer layer is preferably 5 nm or less, more preferably 3 nm or less.

[Emission Color]

In the organic light-emitting device of the present invention, light emission occurs from the delayed blue fluorescent material contained in the delayed blue fluorescent material-containing layer, and from the green fluorescent material and the red fluorescent material contained in the green/red fluorescent material-containing layer, and the emitted colors are combined to give white light. Emission from the delayed blue fluorescent material and from each of the other fluorescent materials include both fluorescent emission and delayed fluorescent emission. However, a part of emission may be partly emission from the host material.

The CIE chromaticity coordinate of the emitted color from the organic light-emitting device is preferably (0.20, 0.30) to (0.46, 0.41).

<Other Layers Constituting Organic Light-Emitting Device>

The organic light-emitting device of the present invention may be constructed as an organic electroluminescent device. The organic electroluminescent device has a structure having an anode, a cathode, and an organic layer formed between the anode and the cathode. The organic layer contains at least a light-emitting layer, and in the organic electroluminescent device of the present invention, the light-emitting layer has a delayed blue fluorescent material-containing layer and a green/red fluorescent material-containing layer, and a spacer arranged between the delayed blue fluorescent material-containing layer and the green/red fluorescent material-containing layer. In the light-emitting layer, any of the delayed blue fluorescent material-containing layer or the green/red fluorescent material-containing layer may be on the anode side or on the cathode side, but preferably, the delayed blue fluorescent material-containing layer is arranged on the cathode side and the green/red fluorescent material-containing layer is arranged on the anode side.

Figure 2:
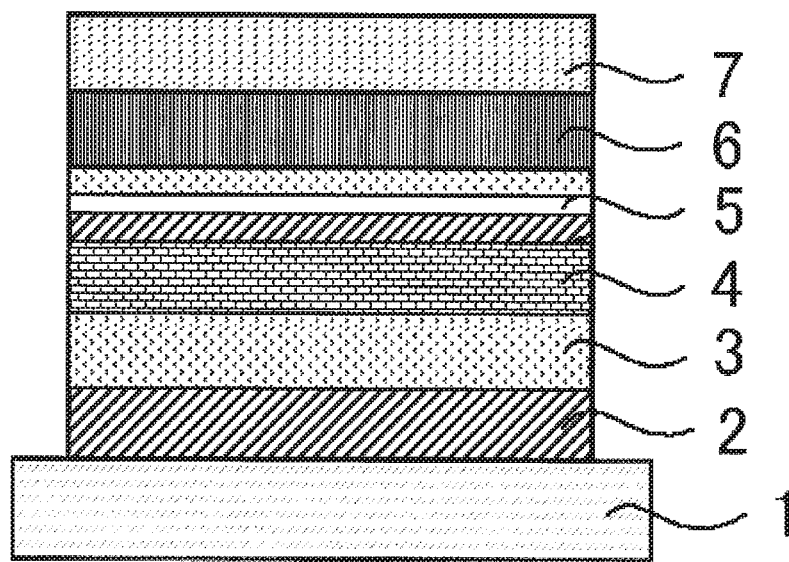
FIG. 2 This is a schematic cross-sectional view showing an example of a layer configuration of an organic electroluminescent device.

The organic layer may be formed of the light-emitting layer alone, or may have one or more other organic layers in addition to the light-emitting layer. Such other organic layers include a hole transport layer, a hole injection layer, an electron barrier layer, a hole harrier layer, an electron injection layer, an electron transport layer, an exciton barrier layer, etc. The hole transport layer may also be a hole injection transport layer having a hole injection function, and the electron transport layer may also be an electron injection transport layer having an electron injection function. A specific configuration example of the organic electroluminescent device is shown in FIG. 2. In FIG. 2, 1 is a substrate, 2 is an anode, 3 is a hole injection layer, 4 is a hole transport layer, 5 is a light-emitting layer, 6 is an electron transport layer, and 7 is a cathode.

In the following, the other members and layers than the light-emitting layer of the organic electroluminescent device are described.

[Substrate]

The organic electroluminescent device of the invention is preferably supported by a substrate. The substrate is not particularly limited and may be those that have been commonly used in an organic electroluminescent device, and examples thereof used include those formed of glass, transparent plastics, quartz and silicon.

[Anode]

The anode in the organic electroluminescent device is preferably formed of, as an electrode material, a metal, an alloy or an electroconductive compound each having a large work function (4 eV or more), or a mixture thereof. Specific examples of the electrode material include a metal, such as Au, and an electroconductive, transparent material, such as CuI, indium tin oxide (ITO), $SnO_2$ and ZnO. A material that is amorphous and is capable of forming a transparent electroconductive film, such as IDIXO ($In_2O_3$—ZnO), may also be used. The anode may be formed in such a manner that the electrode material is formed into a thin film by such a method as vapor deposition or sputtering, and the film is patterned into a desired pattern by a photolithography method, or in the case where the pattern may not require high accuracy (for example, approximately 100 μm or more), the pattern may be formed with a mask having a desired shape on vapor deposition or sputtering of the electrode material. In alternative, in the case where a material capable of being applied as a coating, such as an organic electroconductive compound, is used, a wet film forming method, such as a printing method and a coating method, may be used. In the case where emitted light is to be taken out through the anode, the anode preferably has a transmittance of more than 10%, and the anode preferably has a sheet resistance of several hundred ohm per square or less. The thickness thereof may be generally selected from a range of from 10 to 1,000 nm, and preferably from 10 to 200 nm, while depending on the material used.

[Cathode]

The cathode is preferably formed of, as an electrode material, a metal (referred to as an electron injection metal), an alloy or an electroconductive compound each having a small work function (4 eV or less), or a mixture thereof. Specific examples of the electrode material include sodium, a sodium-potassium alloy, magnesium, lithium, a magnesium-copper mixture, a magnesium-silver mixture, a magnesium-aluminum mixture, a magnesium-indium mixture, an aluminum-aluminum oxide ($Al_2O_3$) mixture, indium, a lithium-aluminum mixture, and a rare earth metal. Among these, a mixture of an electron injection metal and a second metal that is a stable metal having a larger work function than the electron injection metal, for example, a magnesium-silver mixture, a magnesium-aluminum mixture, a magnesium-indium mixture, an aluminum-aluminum oxide ($Al_2O_3$) mixture, a lithium-aluminum mixture, and aluminum, are preferred from the standpoint of the electron injection property and the durability against oxidation and the like. The cathode may be produced by forming the electrode material into a thin film by such a method as vapor deposition or sputtering. The cathode preferably has a sheet resistance of several hundred ohm per square or less, and the thickness thereof may be generally selected from a range of from 10 nm to 5 μm, and preferably from 50 to 200 nm. For transmitting the emitted light, any one of the anode and the cathode of the organic electroluminescent device is preferably transparent or translucent, thereby enhancing the light emission luminance.

The cathode may be formed with the electroconductive transparent materials described for the anode, thereby forming a transparent or translucent cathode, and by applying the cathode, a device having an anode and a cathode, both of which have transmittance, may be produced.

[Injection Layer]

The injection layer is a layer that is provided between the electrode and the organic layer, for decreasing the driving voltage and enhancing the light emission luminance, and includes a hole injection layer and an electron injection layer, which may be provided between the anode and the light emitting layer or the hole transporting layer and between the cathode and the light emitting layer or the electron transport layer. The injection layer may be provided depending on necessity.

[Barrier Layer]

The barrier layer is a layer that is capable of inhibiting charges (electrons or holes) and/or excitons present in the light emitting layer from being diffused outside the light emitting layer. The electron barrier layer may be disposed between the light emitting layer and the hole transport layer, and inhibits electrons from passing through the light emitting layer toward the hole transport layer. Similarly, the hole barrier layer may be disposed between the light emitting layer and the electron transport layer, and inhibits holes from passing through the light emitting layer toward the electron transport layer. The barrier layer may also be used for inhibiting excitons from being diffused outside the light emitting layer. Thus, the electron barrier layer and the hole barrier layer each may also have a function as an exciton barrier layer. The term the electron harrier layer or the exciton barrier layer referred to herein is intended to include a layer that has both the functions of an electron harrier layer arid an exciton barrier layer by one layer.

[Hole Barrier Layer]

The hole barrier layer has the function of an electron transporting layer in a broad sense. The hole barrier layer has a function of inhibiting holes from reaching the electron transport layer while transporting electrons, and thereby enhances the recombination probability of electrons and holes in the light emitting layer. As the material for the hole barrier layer, the materials for the electron transport layer described later may be used depending on necessity.

[Electron Barrier Layer]

The electron barrier layer has the function of transporting holes in a broad sense. The electron barrier layer has a function of inhibiting electrons from reaching the hole transport layer while transporting holes, and thereby enhances the recombination probability of electrons and holes in the light emitting layer.

[Exciton Barrier Layer]

The exciton barrier layer is a layer for inhibiting excitons generated through recombination of holes and electrons in the light emitting layer from being diffused to the charge transport layer, and the use of the layer inserted enables effective confinement of excitons in the light emitting layer, and thereby enhances the light emission efficiency of the device. The exciton barrier layer may be inserted adjacent to the light emitting layer on any of the side of the anode and the side of the cathode, and on both the sides. Specifically, in the case where the exciton barrier layer is present on the side of the anode, the layer may be inserted between the hole transport layer and the light emitting layer and adjacent to the light emitting layer, and in the case where the layer is inserted on the side of the cathode, the layer may be inserted between the light emitting layer and the cathode and adjacent to the light emitting layer. Between the anode and the exciton barrier layer that is adjacent to the light emitting layer on the side of the anode, a hole injection layer, an electron barrier layer and the like may be provided, and between the cathode and the exciton hairier layer that is adjacent to the light emitting layer on the side of the cathode, an electron injection layer, an electron transport layer, a hole barrier layer and the like may be provided. In the case where the barrier layer is provided, the material used for the barrier layer preferably has excited singlet energy and excited triplet energy, at least one of which is higher than the excited singlet energy and the excited triplet energy of the light emitting material, respectively.

[Hole Transport Layer]

The hole transport layer is formed of a hole transporting material having a function of transporting holes, and the hole transport layer may be provided as a single layer or plural layers.

The hole transporting material has one of injection or transporting property of holes and harrier property of electrons, and may be any of an organic material and an inorganic material. Examples of known hole transporting materials that may be used herein include a triazole derivative, an oxadiazole derivative, an imidazole derivative, a carbazole derivative, an indolocarhazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline copolymer and an electroconductive polymer oligomer, particularly a thiophene oligomer. Among these, a porphyrin compound, an aromatic tertiary amine compound and a styrylamine compound are preferably used, and an aromatic tertiary amine compound is more preferably used.

[Electron Transport Layer]

The electron transporting layer is formed of a material having a function of transporting electrons, and the electron transporting layer may be provided as a single layer or plural layers.

The electron transporting material (which may also function as a hole barrier material in some cases) needs only to have a function of transporting electrons, which are injected from the cathode, to the light emitting layer. Examples of the electron transport layer that may be used herein include a nitro-substituted fluorene derivative, a diphenylquinone derivative, a thiopyran dioxide derivative, carbodiimide, a fluorenylidene methane derivative, anthraquinodimethane and anthrone derivatives, and oxadiazole derivative. The electron transporting material used may be a thiadiazole derivative obtained by replacing the oxygen atom of the oxadiazole ring of the oxadiazole derivative by a sulfur atom, or a quinoxaline derivative having a quinoxaline ring, which is known as an electron attractive group. Furthermore, polymer materials having these materials introduced to the polymer chain or having these materials used as the main chain of the polymer may also be used.

In producing the organic electroluminescent device, the method for forming the organic layers is not specifically limited, and the layers may be formed by any of a dry process and a wet process.

Specific examples of preferred materials that may be used in the organic electroluminescent device are shown below, but the materials that may be used in the invention are not construed as being limited to the example compounds. The compound that is shown as a material having a particular function may also be used as a material having another function. In the structural formulae of the example compounds, R, R' and $R_1$ to $R_{10}$ each independently represent a hydrogen atom or a substituent. X represents a carbon atom or a hetero atom to form the ring skeleton, n represents an integer of from 3 to 5, Y represents a substituent, and m represents an integer of 0 or more.

First, preferred examples of compounds that may be used as the host material for the light-emitting layer (delayed fluorescent material-containing layer, green/red fluorescent material-containing layer and spacer layer) are shown below.

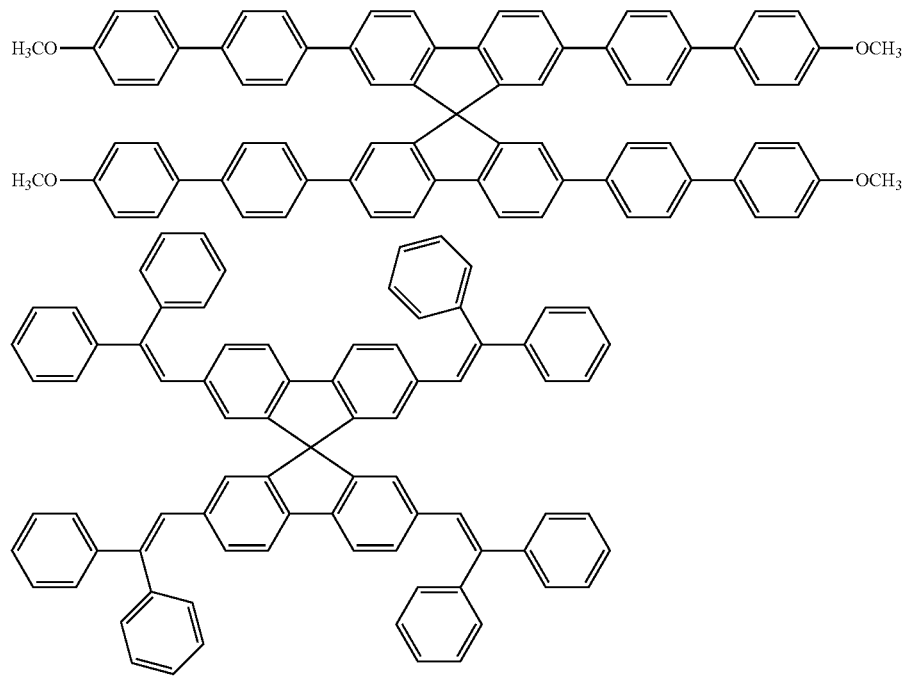

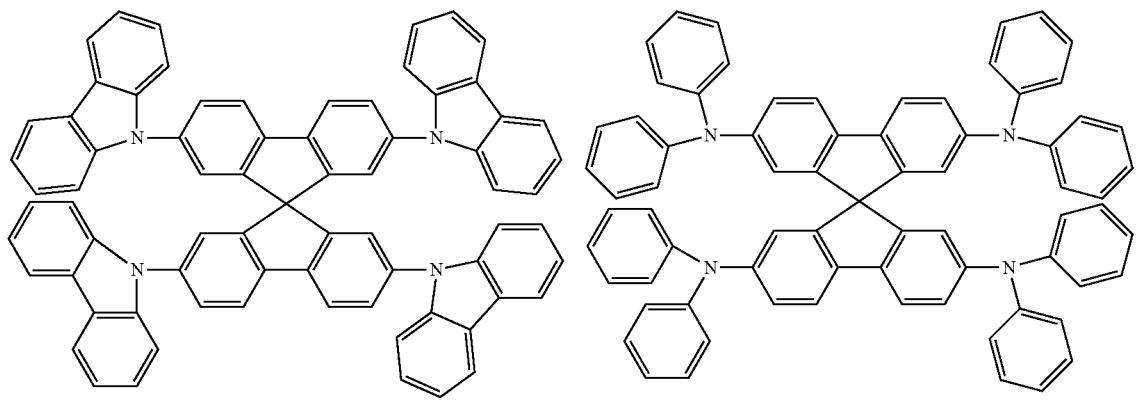
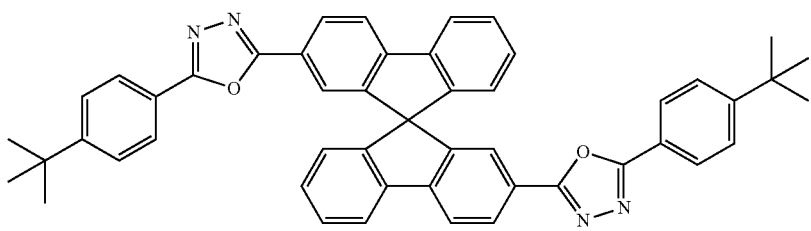
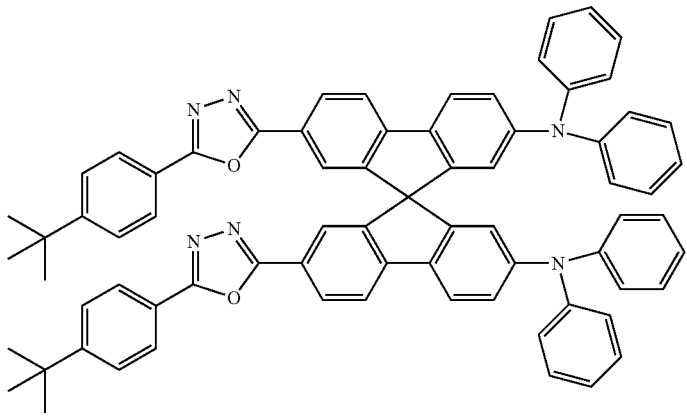
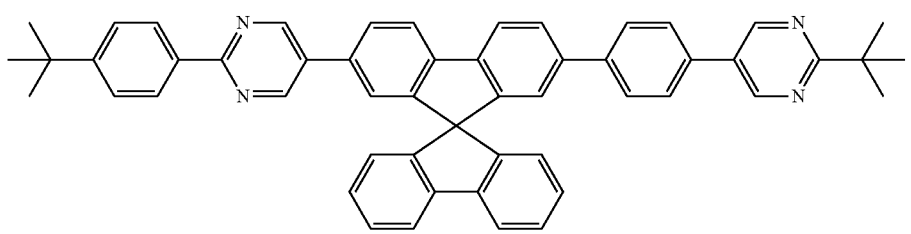

-continued
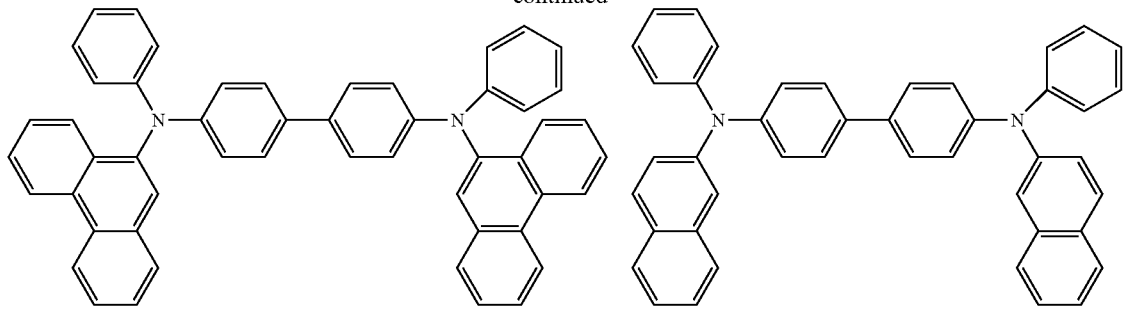
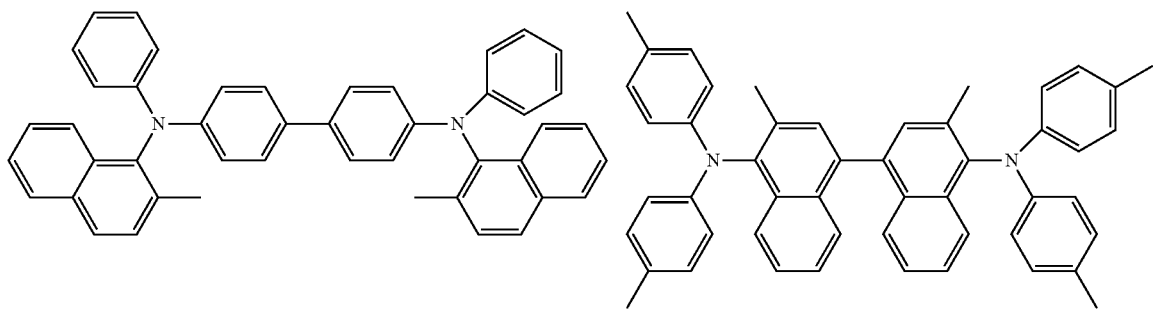
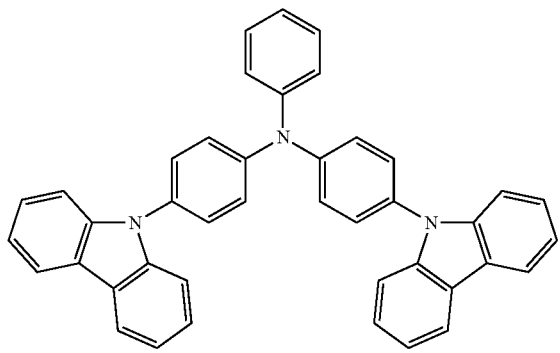
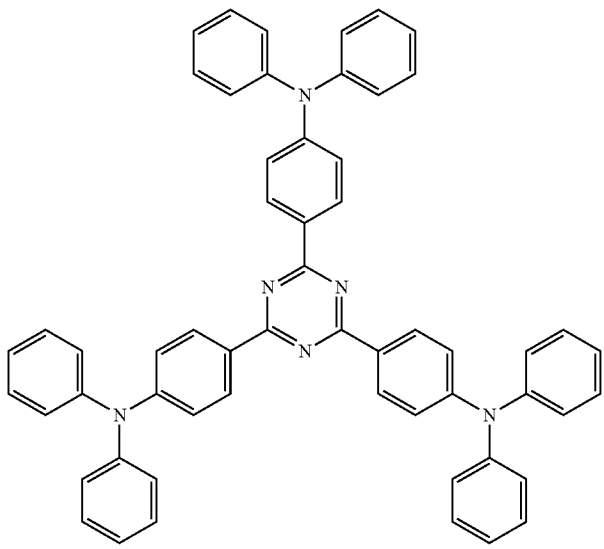

-continued
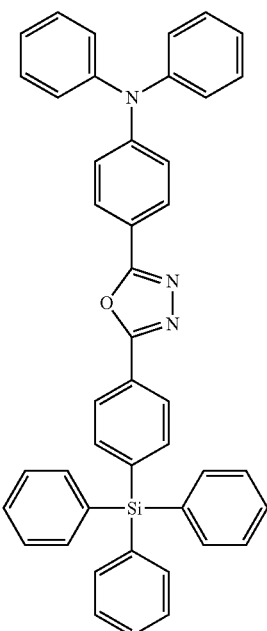
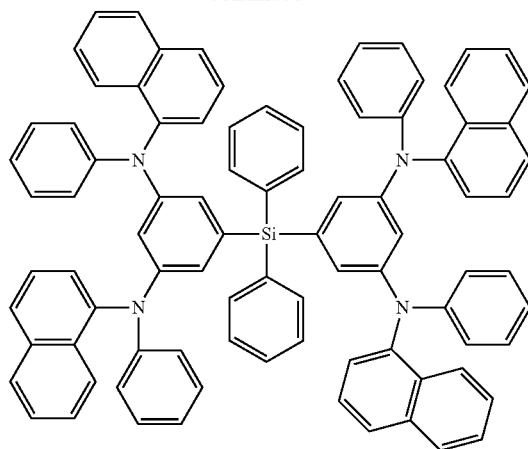
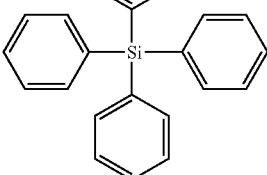
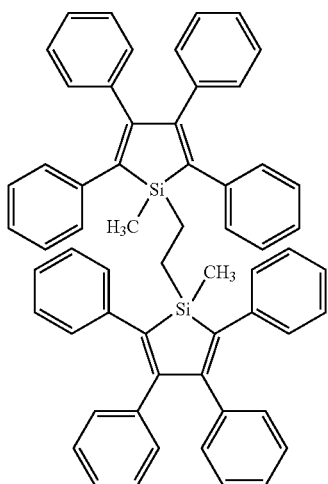
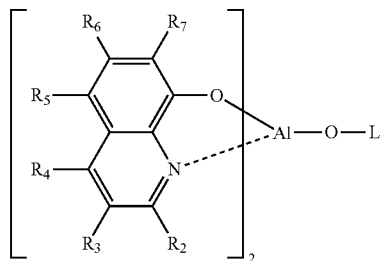
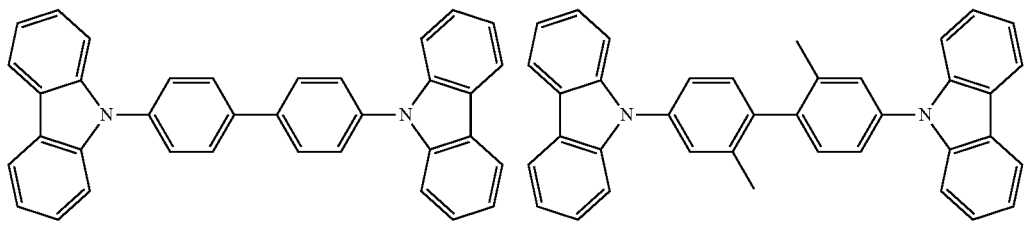
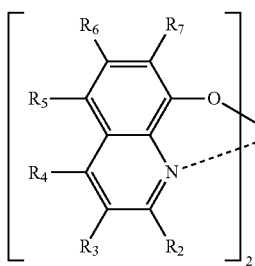
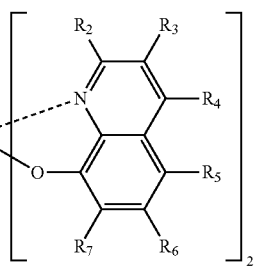

-continued
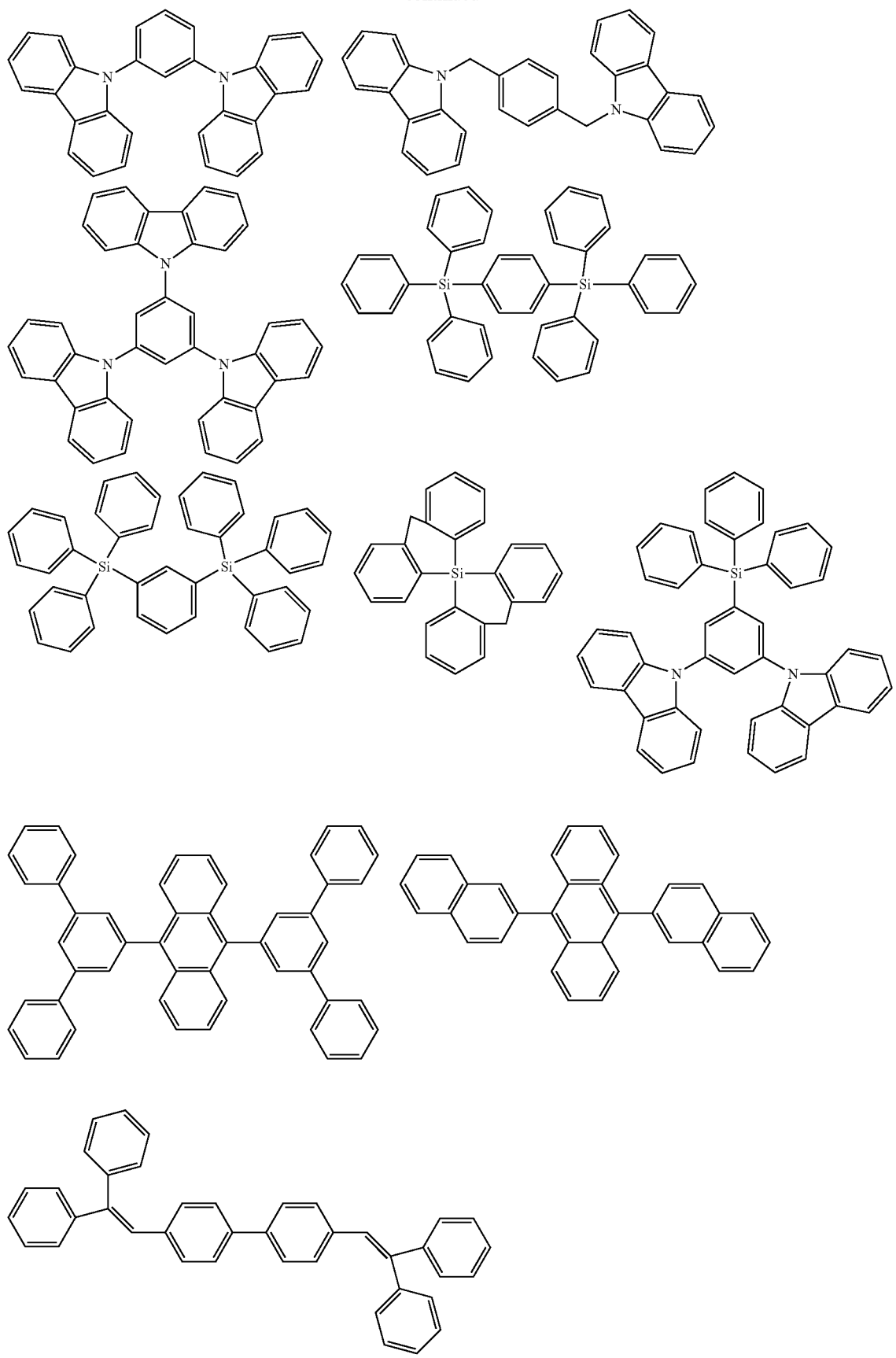

23
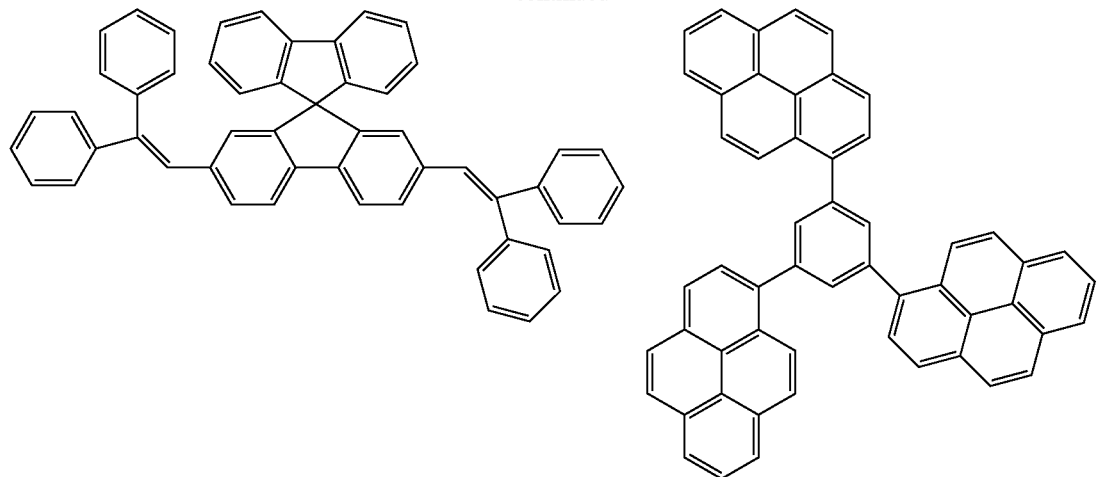
24
-continued
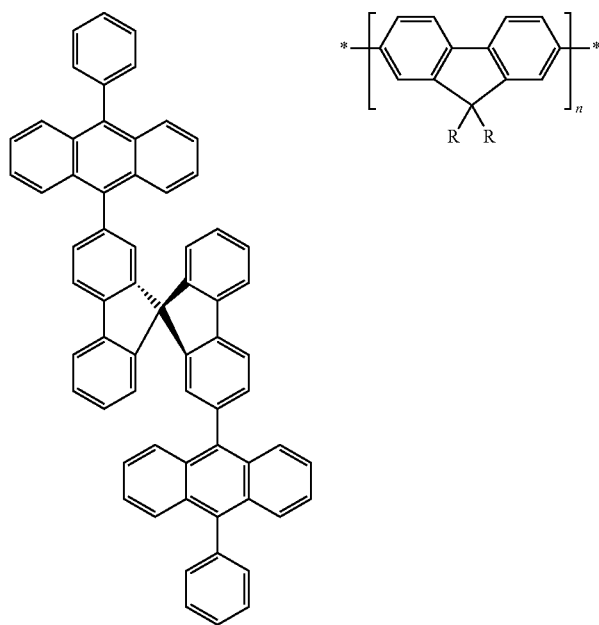
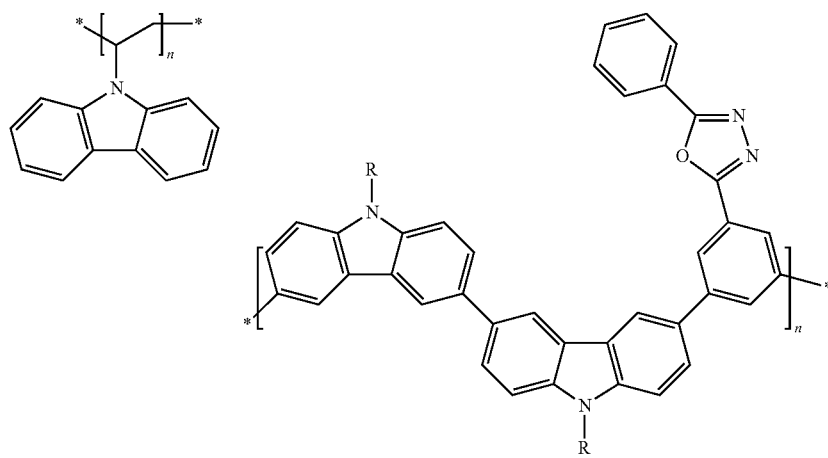

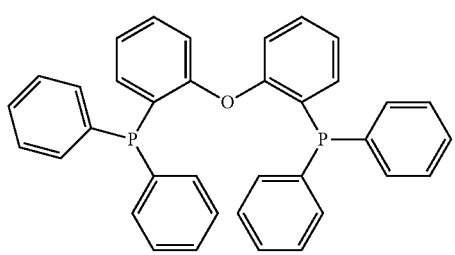
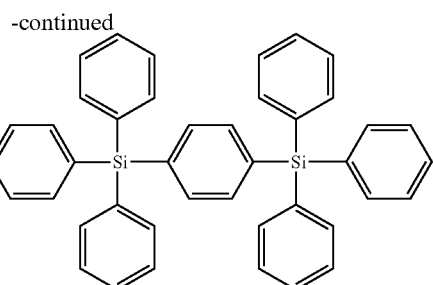
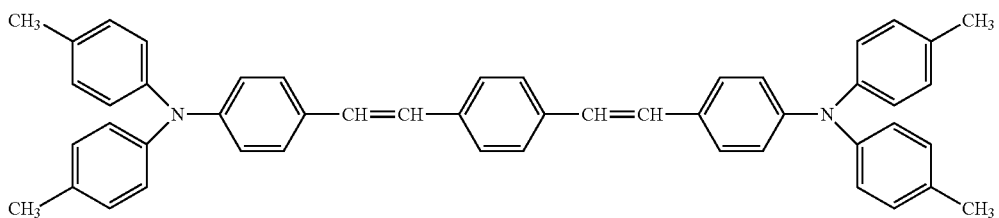
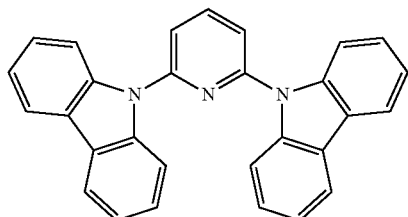
Next, preferred examples of compounds that may be used as the hole injection material are shown below.
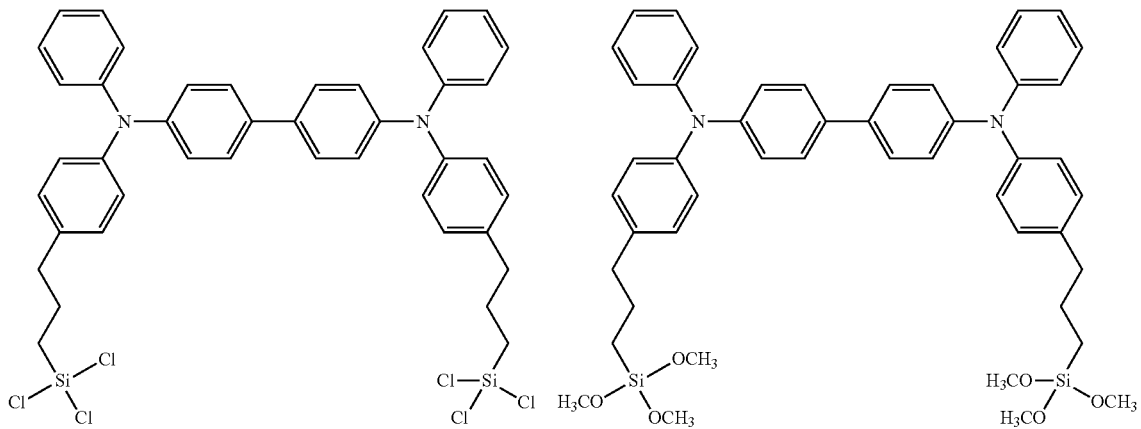
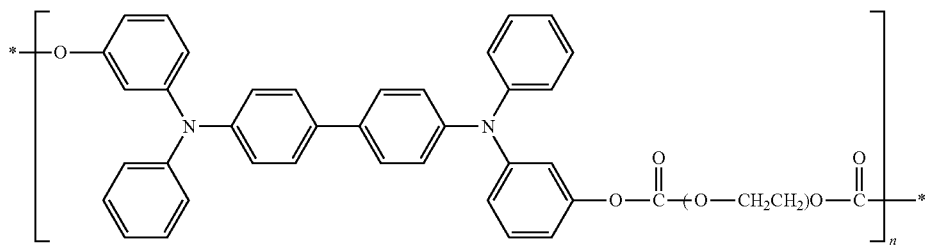

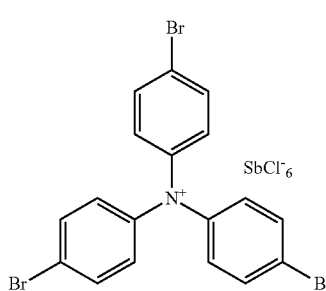
-continued
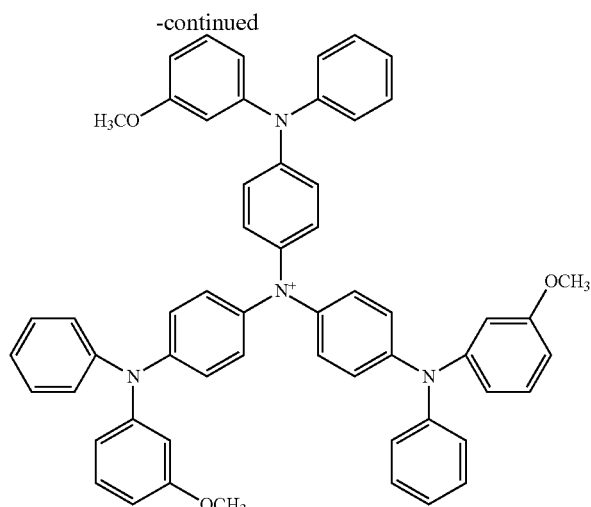
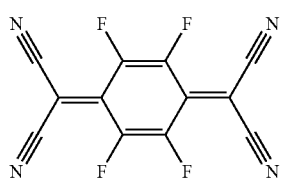
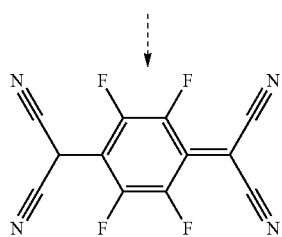
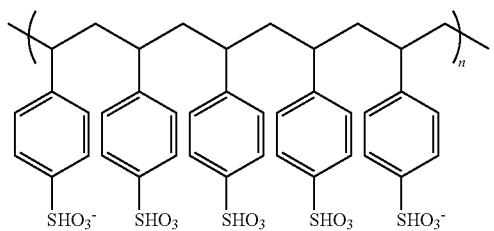
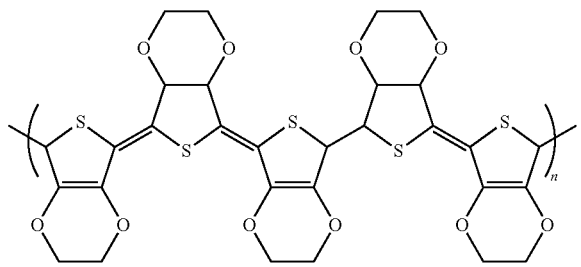
Next, preferred examples of compounds that may be used as the hole transporting material are shown below.
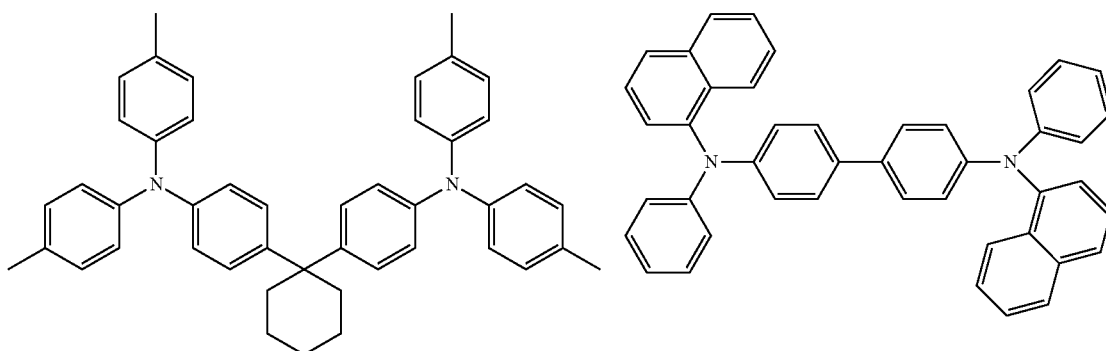

-continued
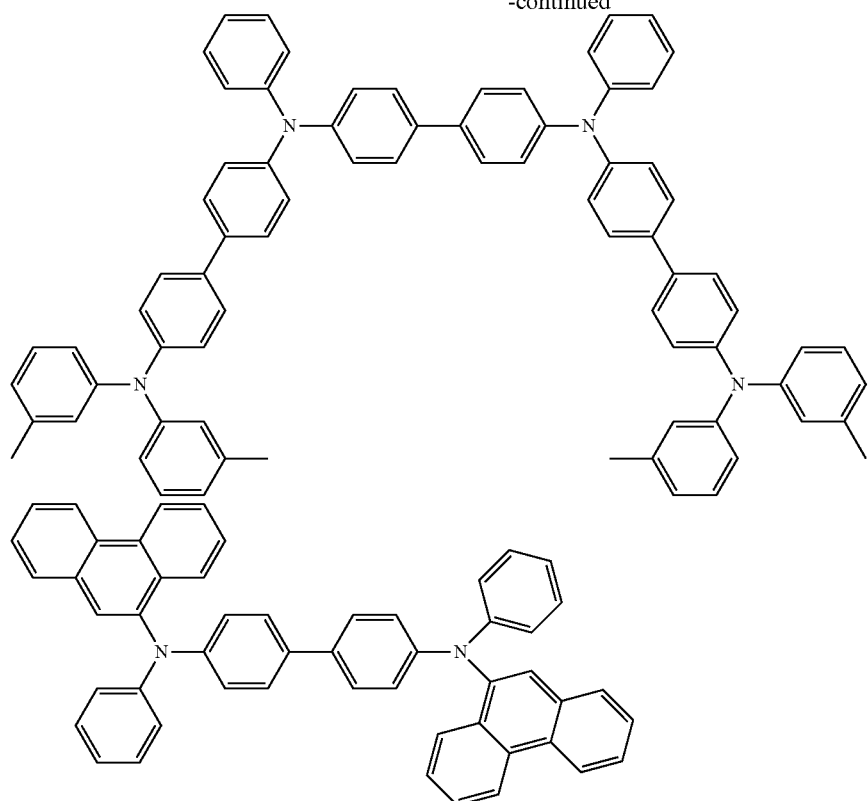
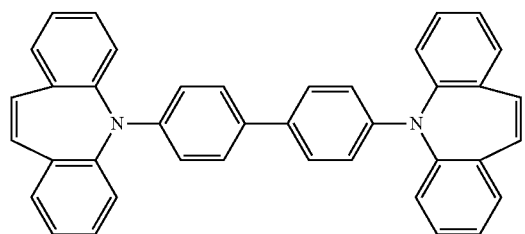
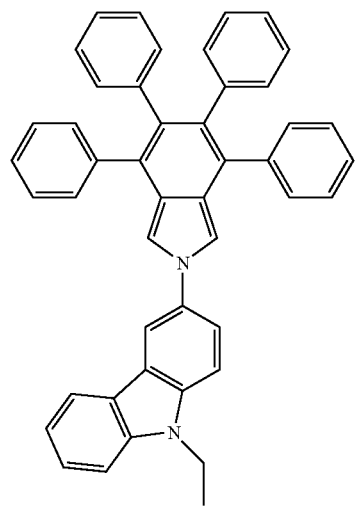
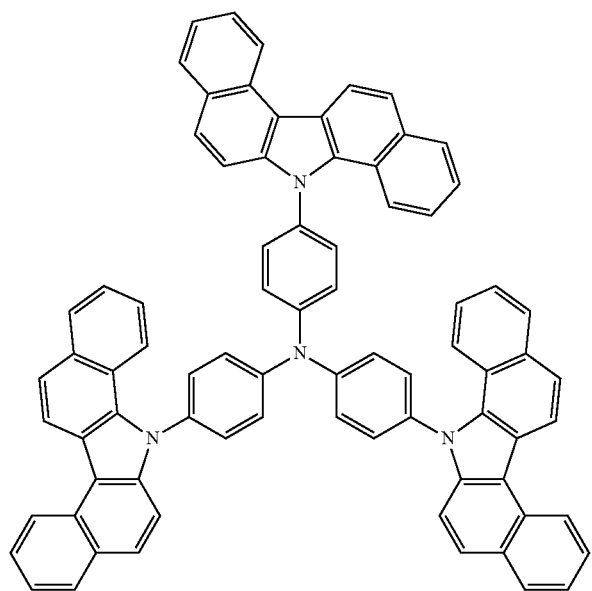

-continued
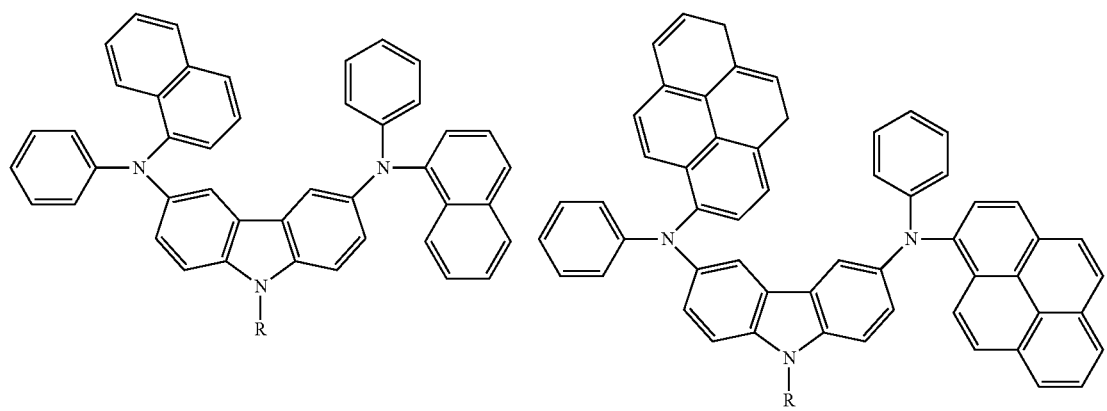
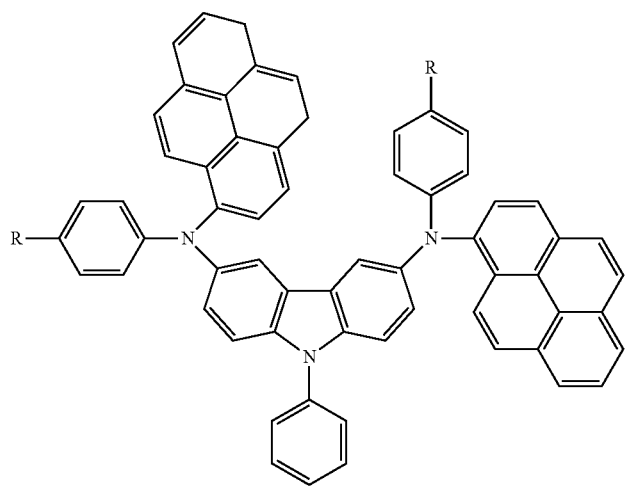
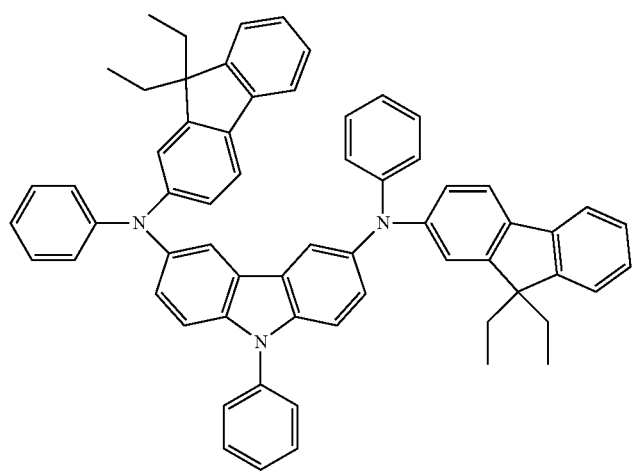

-continued
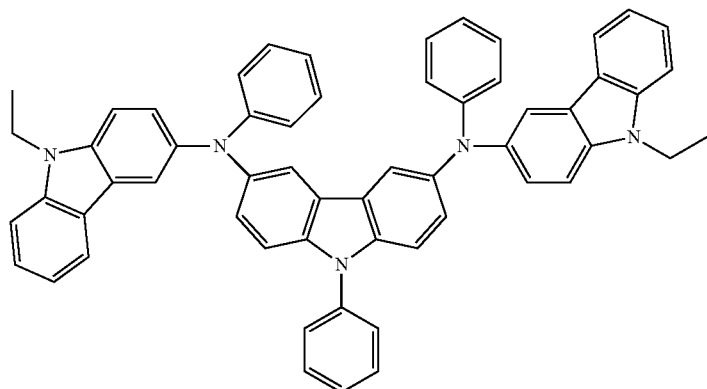
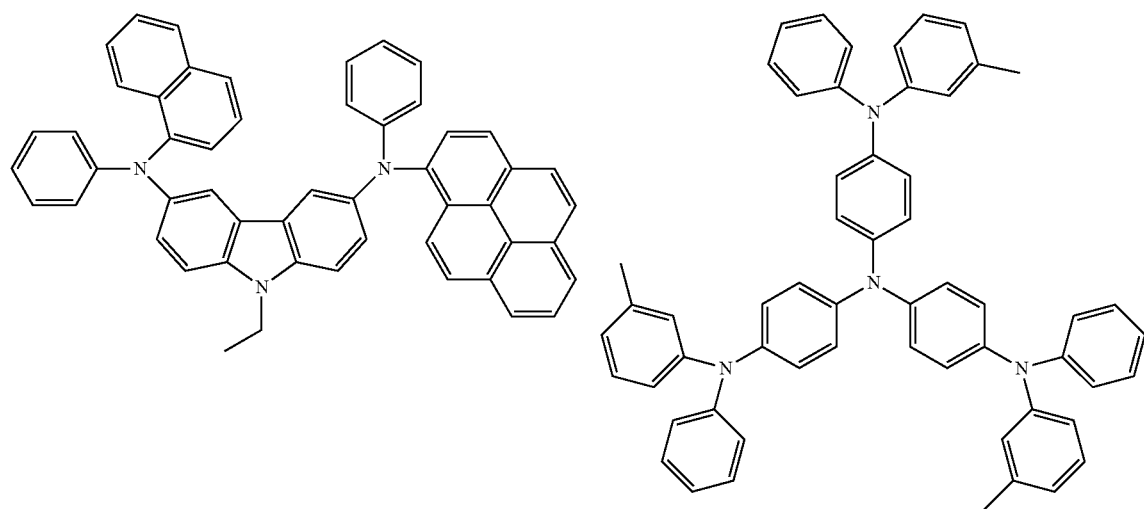
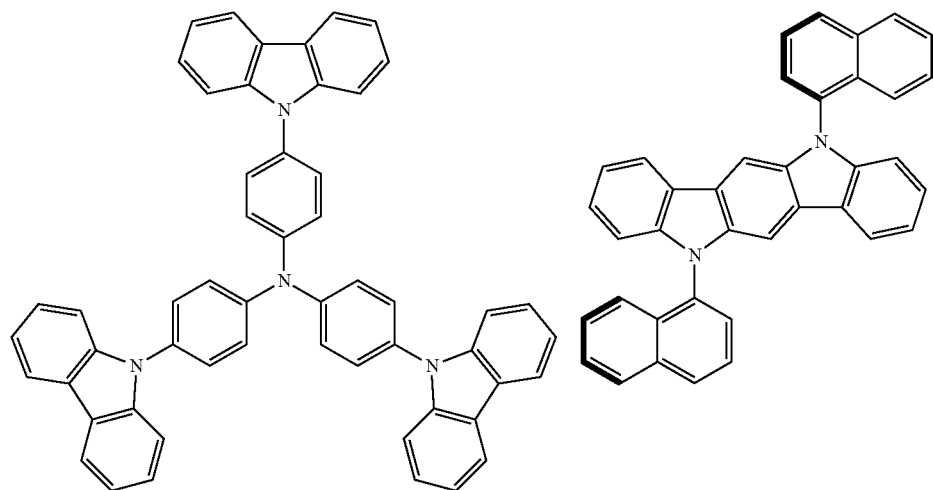

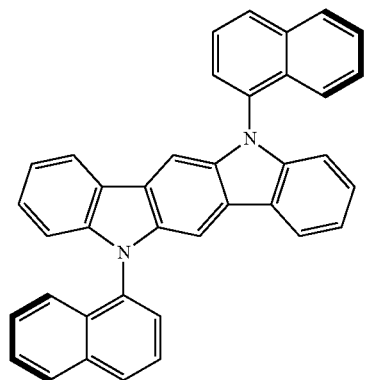
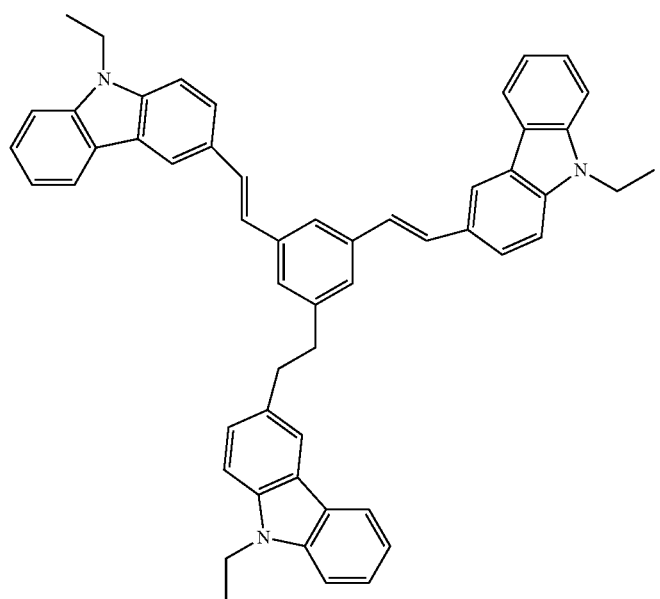
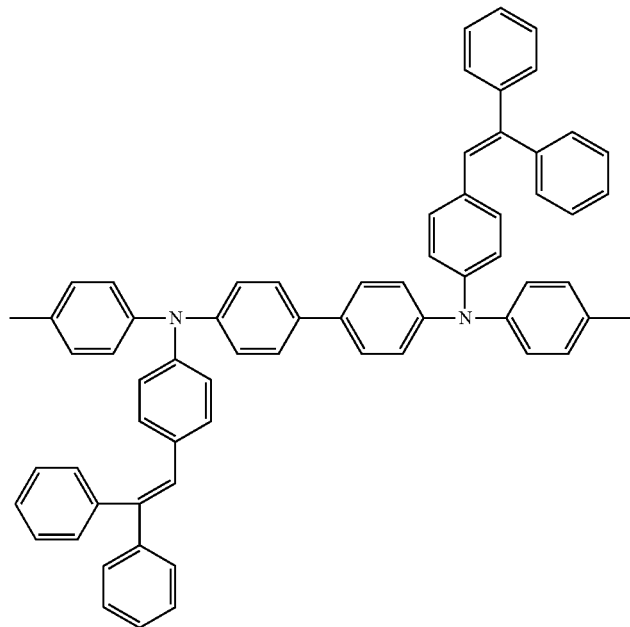

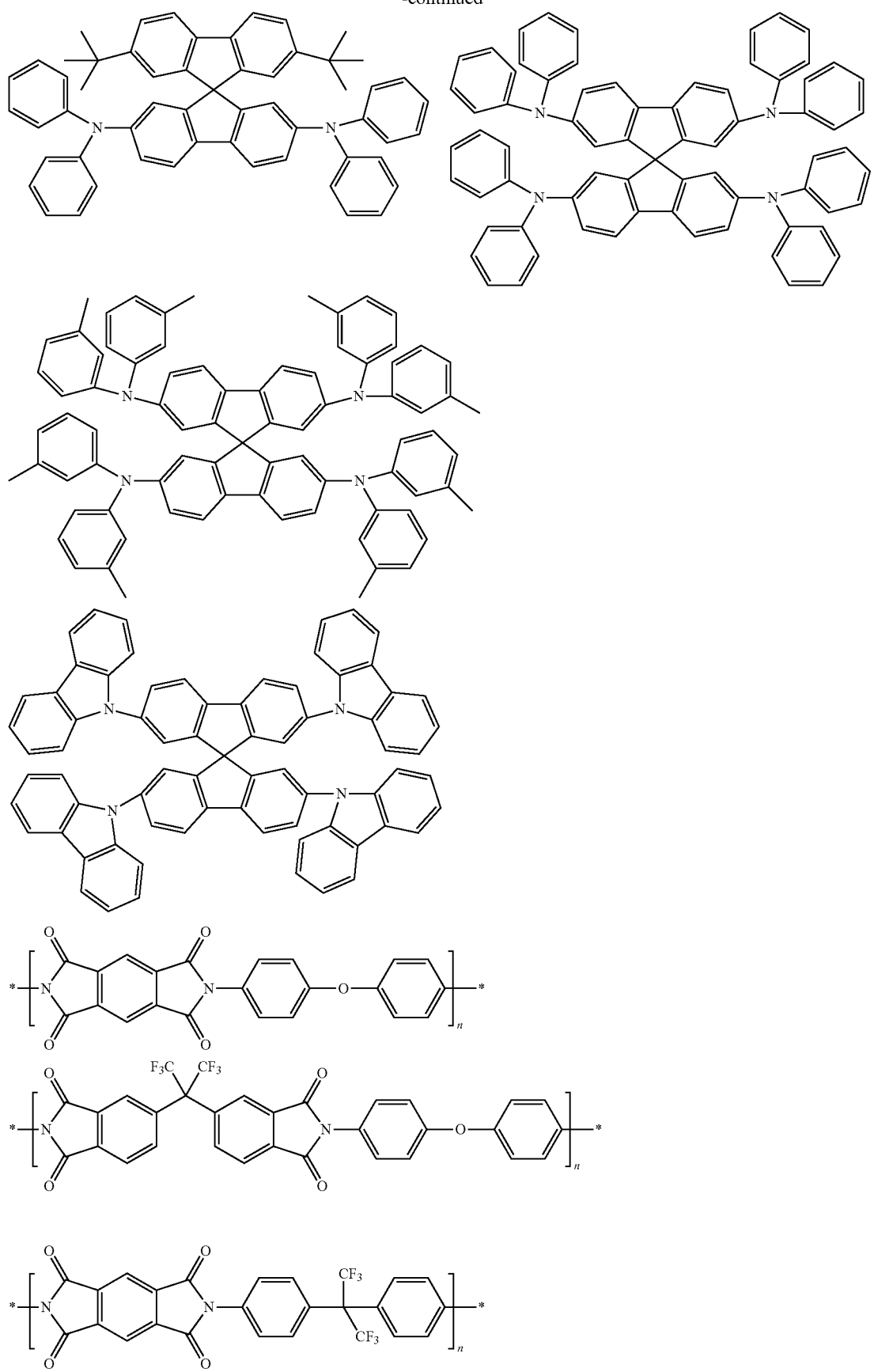

39
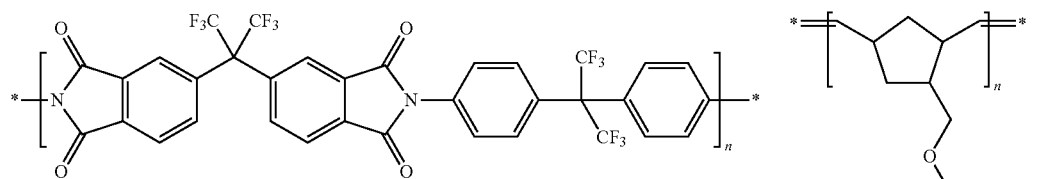
40
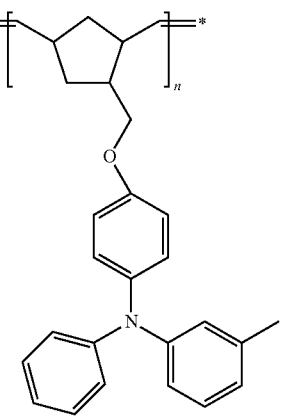
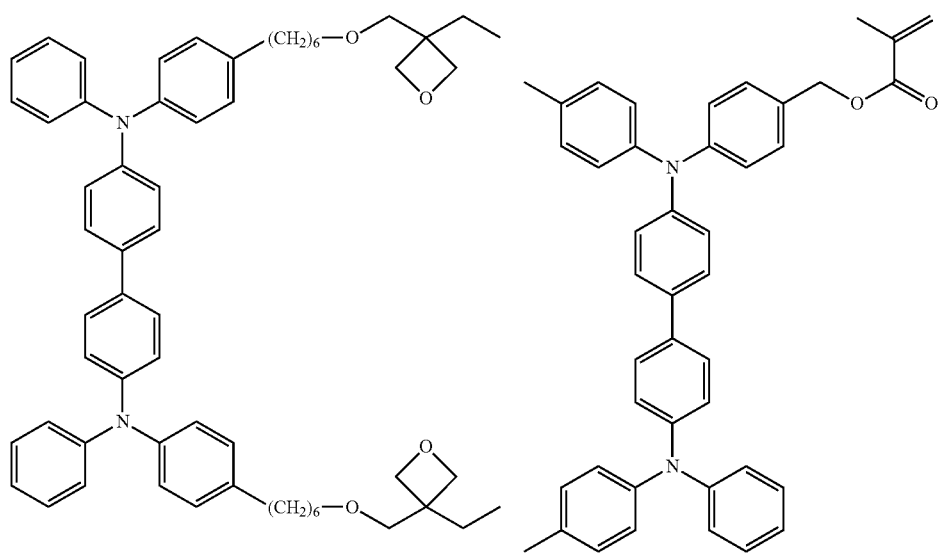
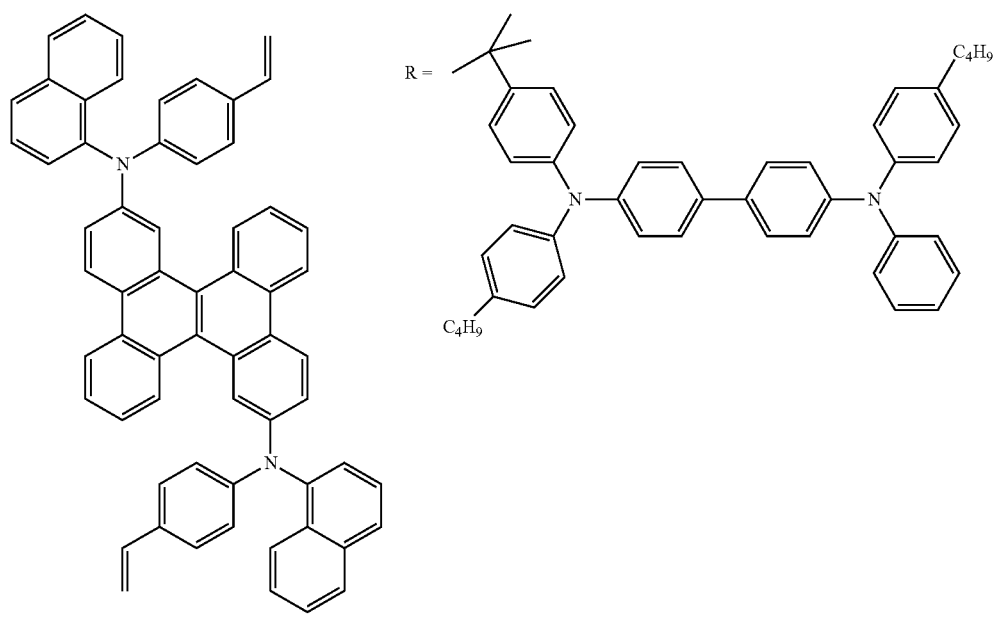

-continued
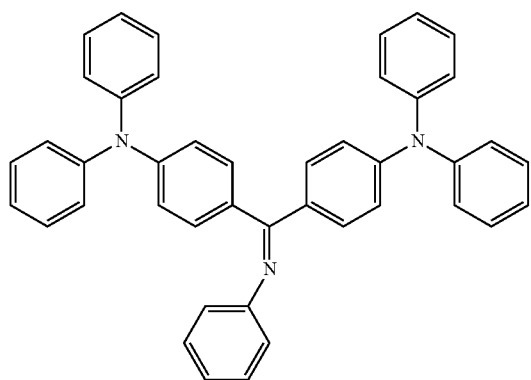
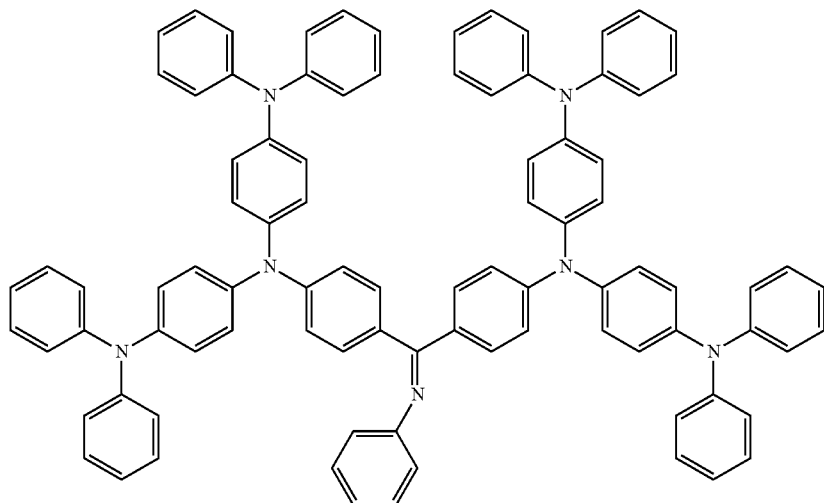
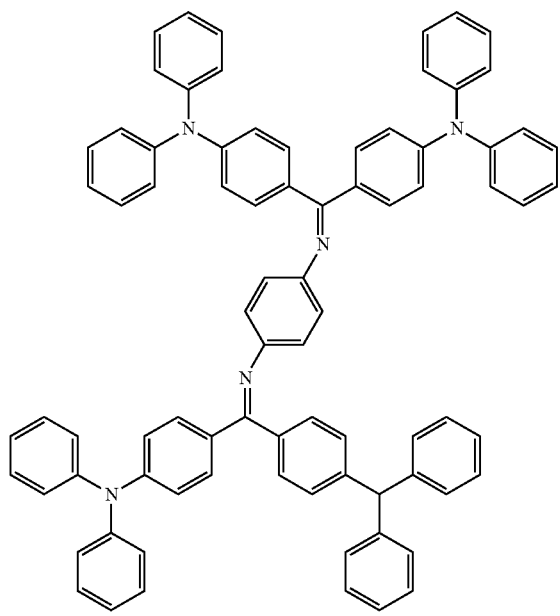

-continued
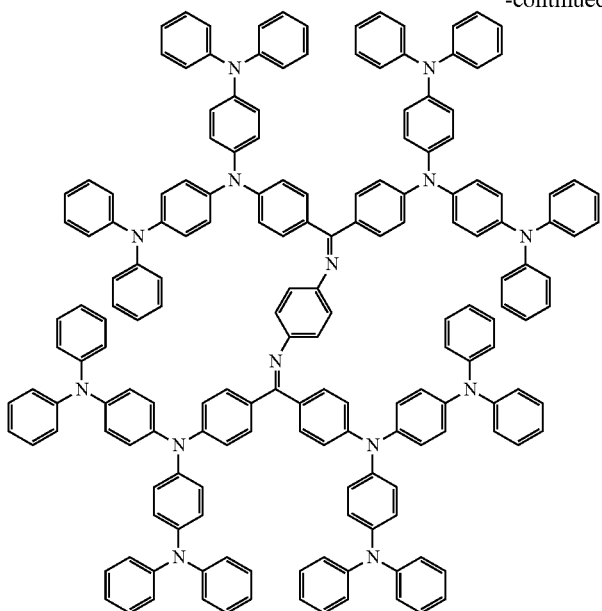
Next, preferred examples of compounds that may be used as the electron barrier material are shown below.
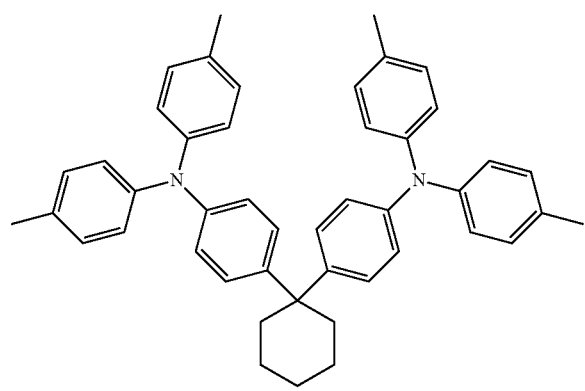
-continued
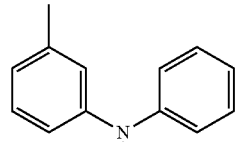
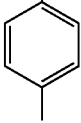
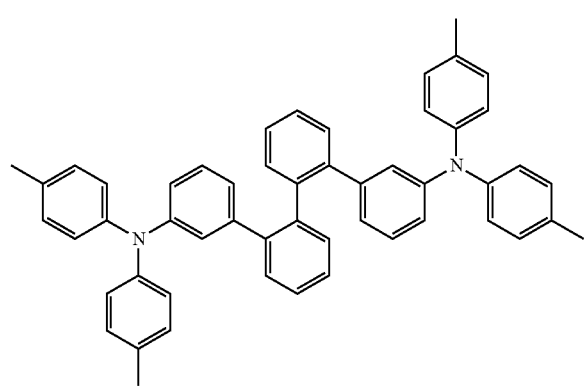
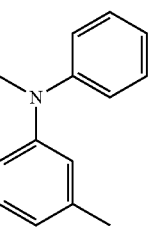
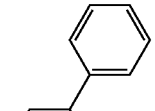
Next, preferred examples of compounds that may be used as the hole barrier material are shown below.

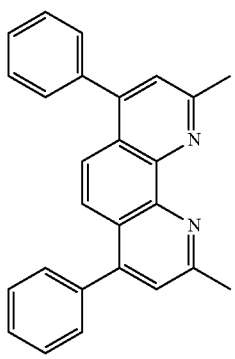
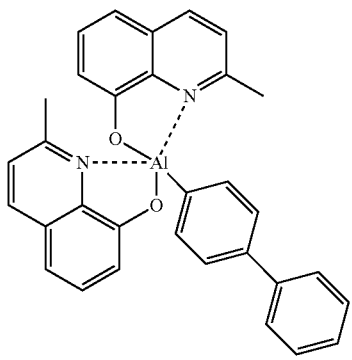
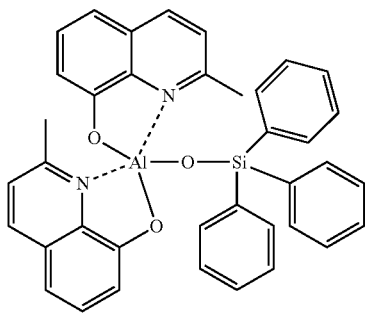
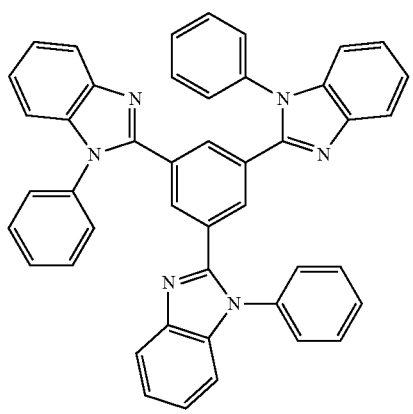
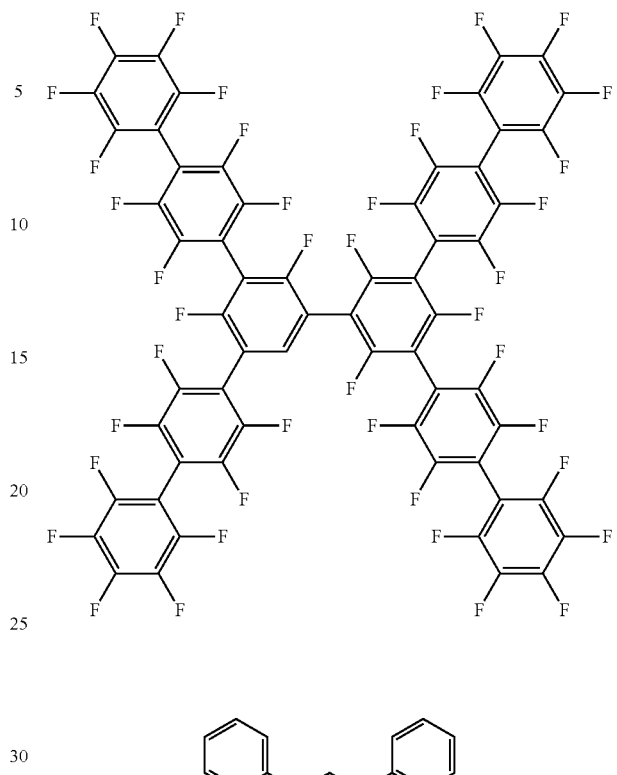
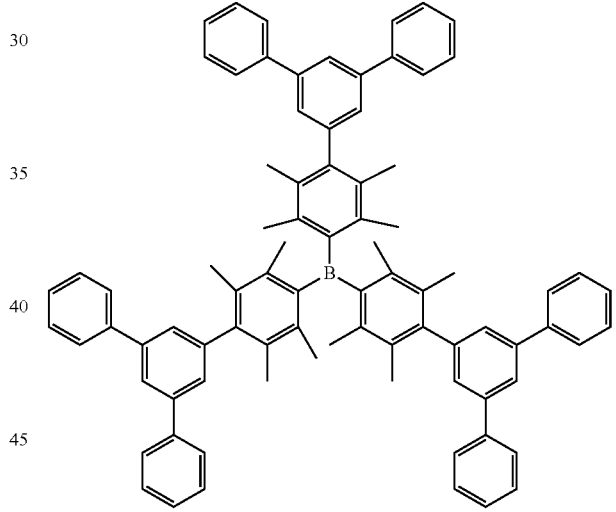
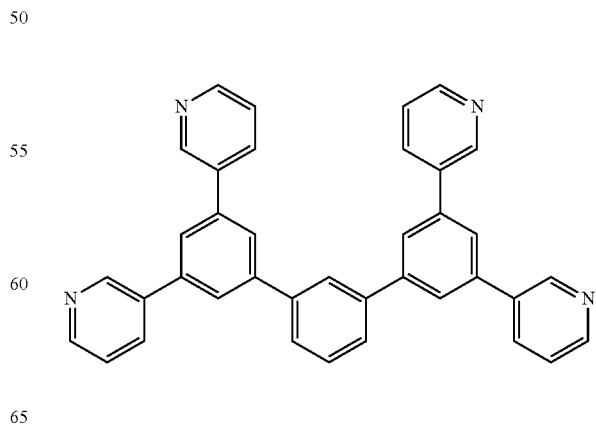

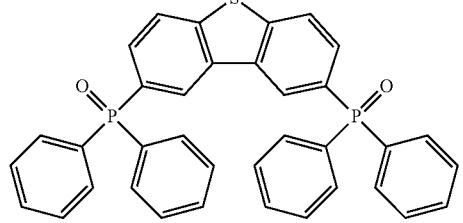
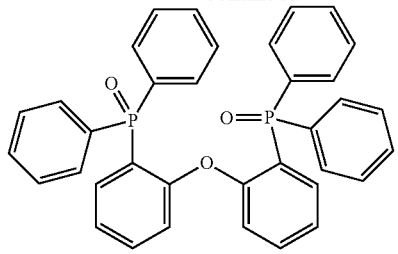 [SMILES: O=P(c1ccccc1)(c1ccccc1)c1ccccc1Oc1ccccc1P(=O)(c1ccccc1)c1ccccc1]
Next, preferred examples of compounds that may be used as the electron transporting material are shown below.
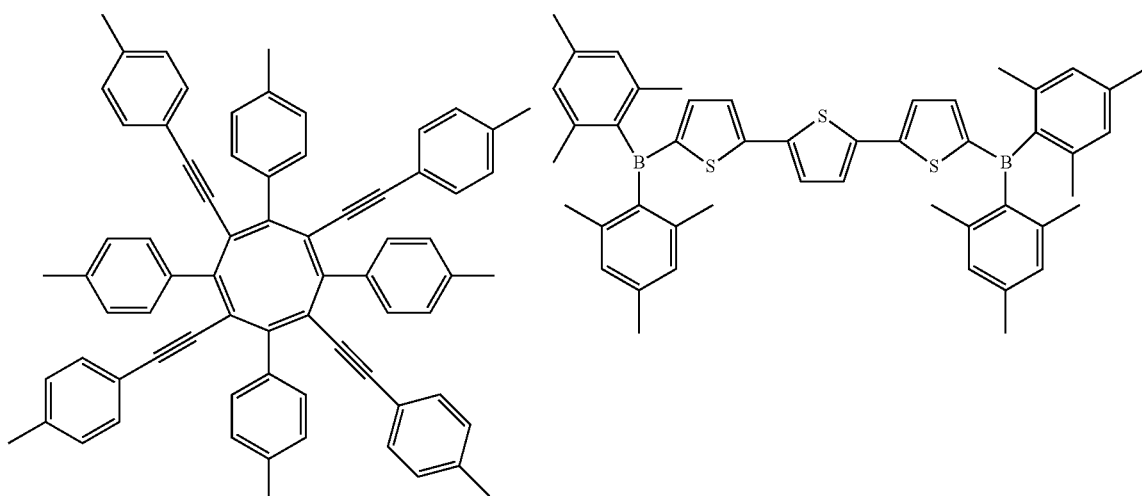
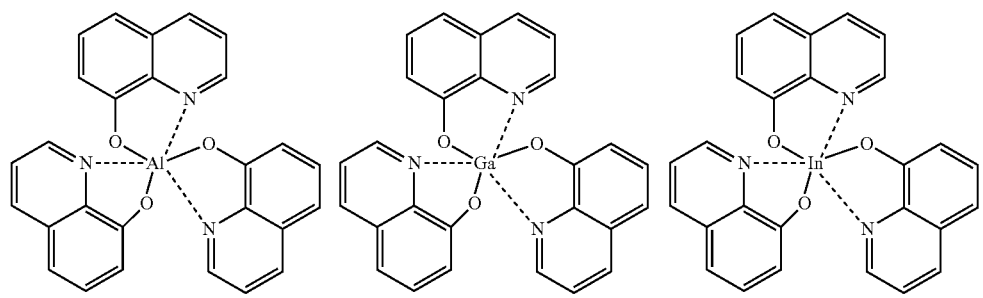
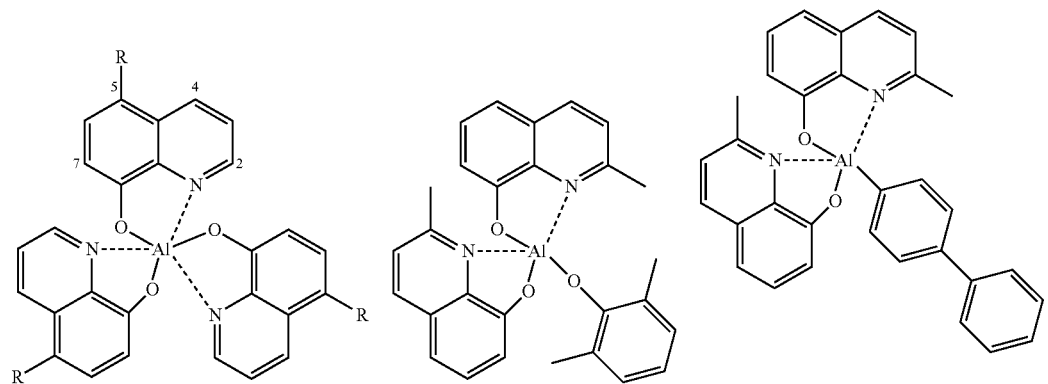

-continued
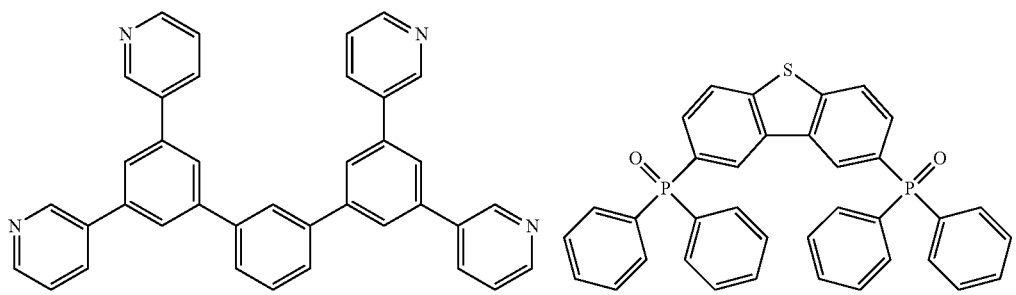
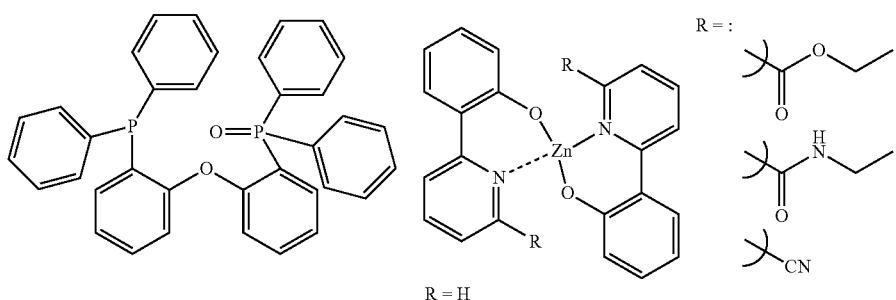
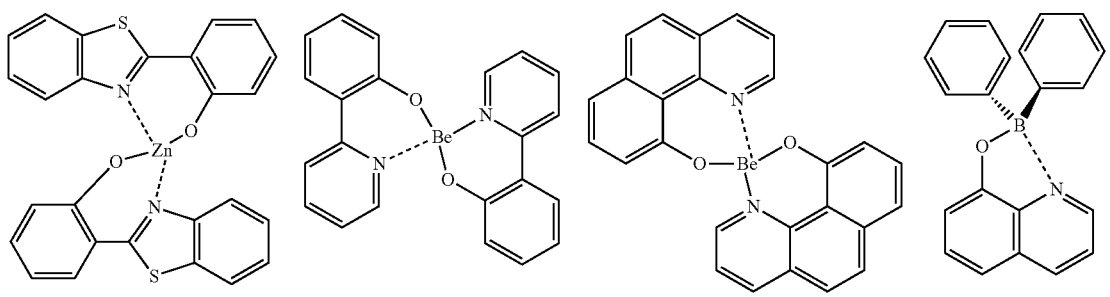
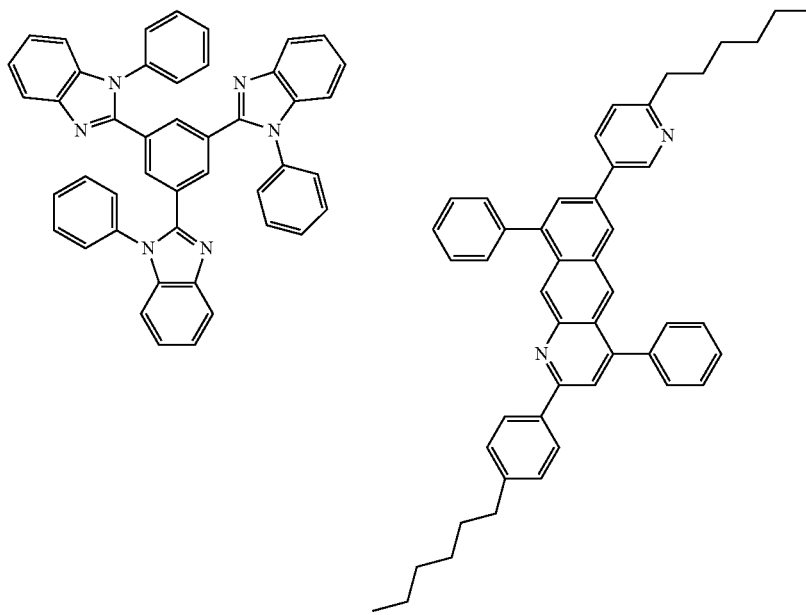

-continued
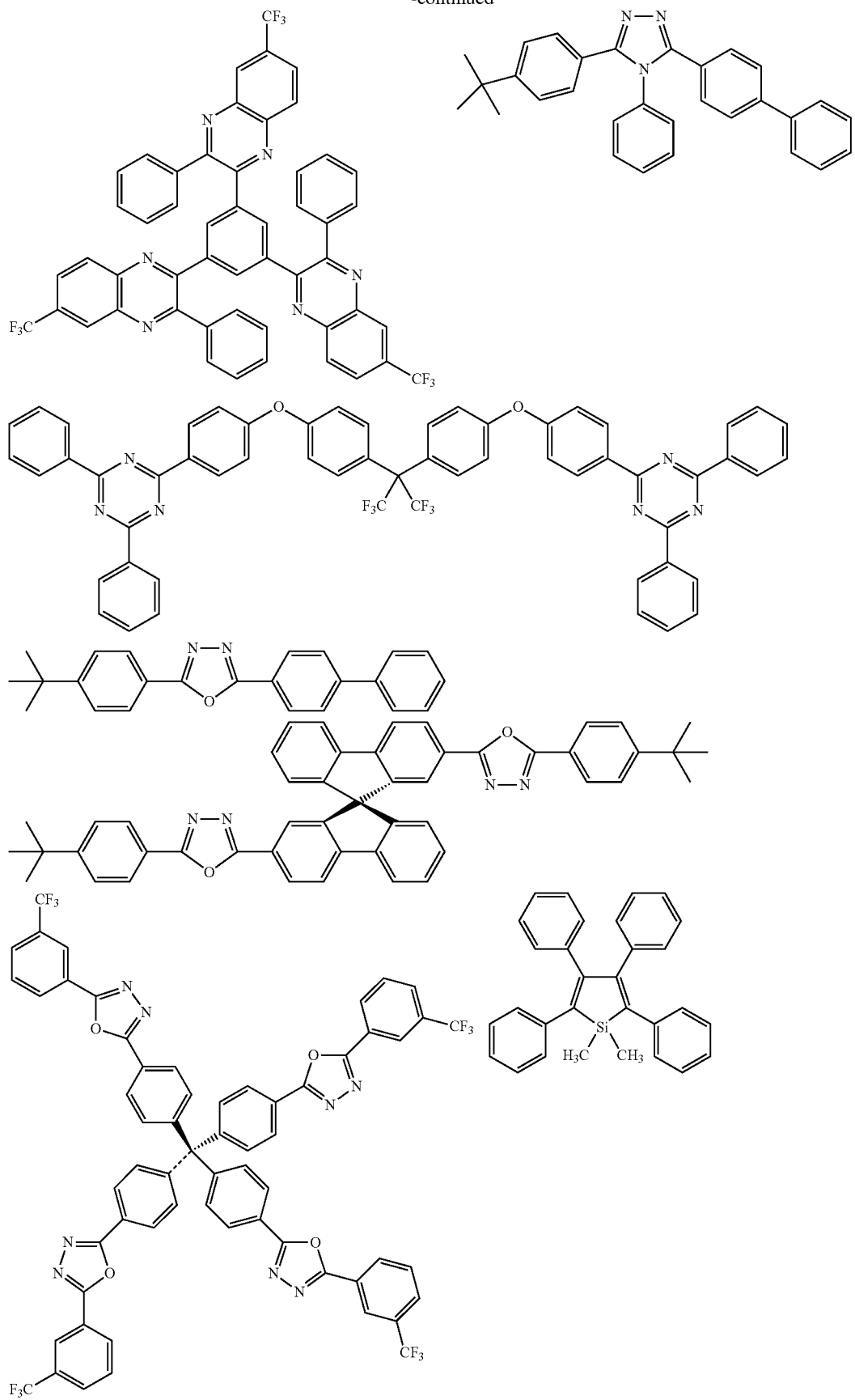

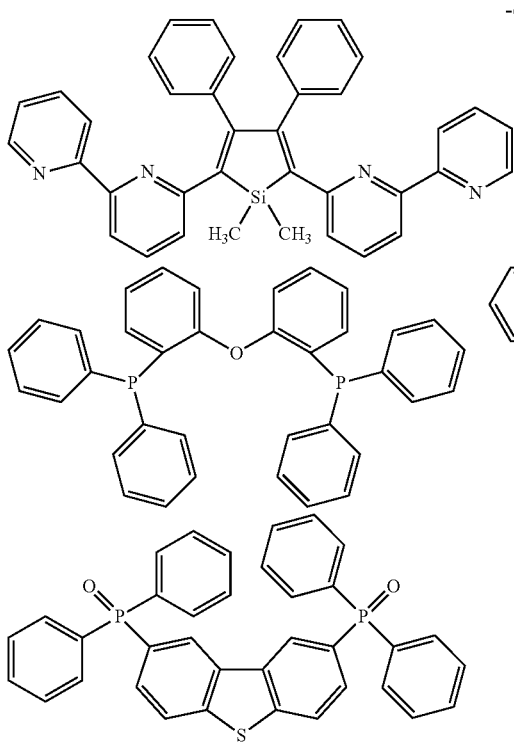
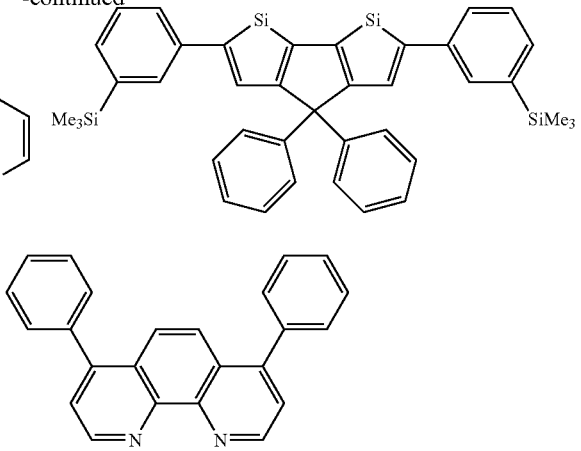
Next, preferred examples of compounds that may be used as the electron injection material are shown below.
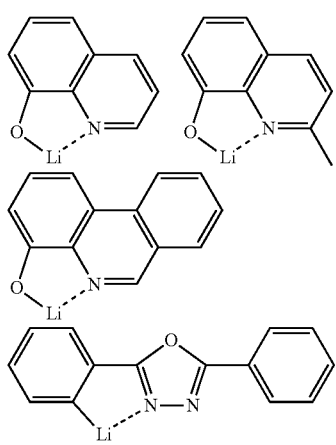
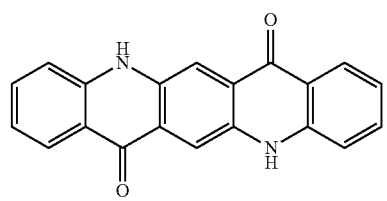
Preferred examples of compounds as a material that may be added are shown below. For example, the compound may be added as a stabilizing material.
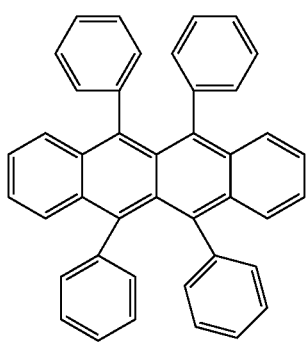
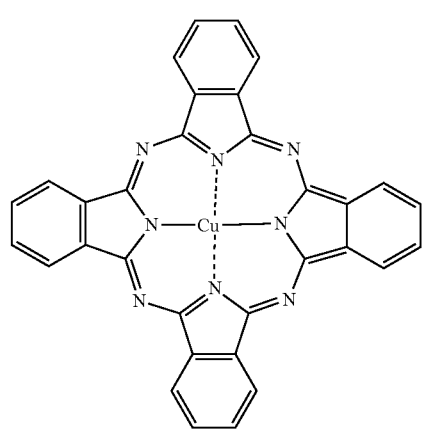

-continued

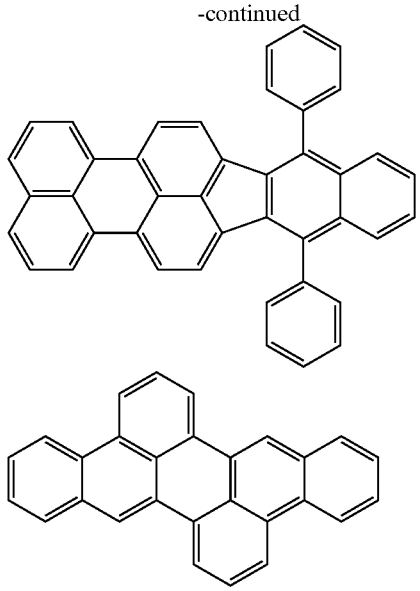

By applying an electric field between the anode and the cathode therein, the delayed fluorescent material-containing layer and the green/red fluorescent material-containing layer in the organic electroluminescent device faun excitons, and when the excitons return to the ground state, blue light, green light and red light are radiated as fluorescent emission and delayed fluorescent emission, and white light is obtained by combining these lights.

In particular, the organic light-emitting device of the present invention can be applied to white emission diodes that are used in organic electroluminescent lighting and backlights that are much in demand in the art. In addition, the organic light-emitting device of the present invention can also be applied to other various uses. For example, using the organic light-emitting device of the present invention, an organic electroluminescent display device can be produced, and for the details thereof, reference may be made to Seiji Tokito, Chiyaha Adachi and Hideyuki Murata, "Yuki EL Display" (Organic EL Display) (Ohmsha, Ltd.).

EXAMPLES

The features of the invention will be described more specifically with reference to examples below. The materials, processes, procedures and the like shown below may be appropriately modified unless they deviate from the substance of the invention. Accordingly, the scope of the invention is not construed as being limited to the specific examples shown below. The device characteristics were evaluated by using Source Meter (2400 Series, manufactured by Keithley Instruments Inc.), Absolute External Quantum Yield Measurement System (C9920-12, manufactured by Hamamatsu Photonics K.K.), Spectrometer (PMA-12, manufactured by Hamamatsu Photonics K.K.).

The lowest excited singlet energy level $E_{S1}$ and the lowest excited triplet energy level $E_{T1}$ of compounds used in examples and comparative examples were measured in the following procedures. The energy difference $\Delta E_{st}$ between the lowest excited singlet state and the lowest excited triplet state at 77 K was determined by measuring the difference between $E_{S1}$ and $E_{T1}$.

(1) Lowest Excited Singlet Energy Level $E_{S1}$

The compound to be measured was vapor-deposited on a Si substrate to produce a specimen, and the specimen was measured for a fluorescent spectrum at ordinary temperature (300 K). In the fluorescent spectrum, the ordinate is the light emission, and the abscissa is the wavelength. A tangent line was drawn for the downfalling part of the light emission spectrum on the short wavelength side, and the wavelength λedge (nm) of the intersection point of the tangent line and the abscissa was obtained. The wavelength value was converted to an energy value according to the following conversion expression to provide the singlet energy $E_{S1}$.

$E_{S1}$ (eV)=1239.85/λedge     Conversion Expression

The light emission spectrum was measured with a nitrogen laser (MNL200, manufactured by Lasertechnik Berlin GmbH) as an excitation light source and Streak Camera (C4334, manufactured by Hamamatsu Photonics K.K.) as a detector.

(2) Lowest Excited Triplet Energy Level $E_{T1}$

The same specimen as used for the singlet energy $E_{S1}$ was cooled to 77 [K], the specimen for measuring phosphorescent light was irradiated with excitation light (337 nm), and the phosphorescence intensity was measured with a streak camera. A tangent line was drawn for the upstanding part of the phosphorescent spectrum on the short wavelength side, and the wavelength λedge (nm) of the intersection point of the tangent line and the abscissa was obtained. The wavelength value was converted to an energy value according to the following conversion expression to provide the triplet energy $E_{T1}$.

$E_{T1}$ (eV)=1239.85/λedge     Conversion Expression

The tangent line for the upstanding part of the phosphorescent spectrum on the short wavelength side was drawn in the following manner. Over the range in the phosphorescent spectrum curve of from the short wavelength end to the maximum peak value closest to the short wavelength end among the maximum peak values of the spectrum, a tangent line was assumed while moving within the range toward the long wavelength side. The gradient of the tangent line was increased while the curve was standing up (i.e., the value of the ordinate was increased). The tangent line that was drawn at the point where the gradient thereof became maximum was designated as the tangent line for the upstanding part of the phosphorescent spectrum on the short wavelength side.

A maximum peak having a peak intensity that was 10% or less of the maximum peak point intensity of the spectrum was not included in the maximum peak values and thus was not designated as the maximum peak value closest to the short wavelength end, and the tangent line that was drawn at the point where the gradient became maximum that was closest to the maximum peak value closest to the short wavelength end was designated as the tangent line for the upstanding part of the phosphorescent spectrum on the short wavelength side.

EXAMPLE 1

Production and Evaluation of Organic Electroluminescent Device Having Green/Red Fluorescent Material-Containing Layer (DBP, TTPA)/mCP Spacer Layer/Delayed Blue Fluorescent Material-Containing Layer (DMACDPS)

On a glass substrate having, as formed thereon, an anode of indium tin oxide (ITO) having a thickness of 110 nm, each thin film was layered according to a vacuum evaporation method at a vacuum degree of $5.0 \times 10^{-5}$ Pa or less. First, on ITO, α-NPD was formed in a thickness of 30 nm. Next, DBP, TTPA and mCP were co-deposited from different vapor deposition sources to form a layer having a thickness of 8 nm to be a green/red fluorescent material-containing layer. At this time, the DBP concentration was 1% by weight, and the TTPA concentration was 10% by weight. Next, mCP were deposited in a thickness of 2 nm to form a spacer layer, and on this, DMACDPS was formed in a thickness of 7.5 nm to be a delayed blue fluorescent material-containing layer. Next, DPEPO was formed in a thickness of 10 nm, and on this, TPBi was formed in a thickness of 40 nm. Further, lithium fluoride (LiF) was vacuum-deposited in a thickness of 0.5 nm, and then aluminum (Al) was deposited in a thickness of 100 nm to form a cathode, thereby producing an organic electroluminescent device.

Figure 3:
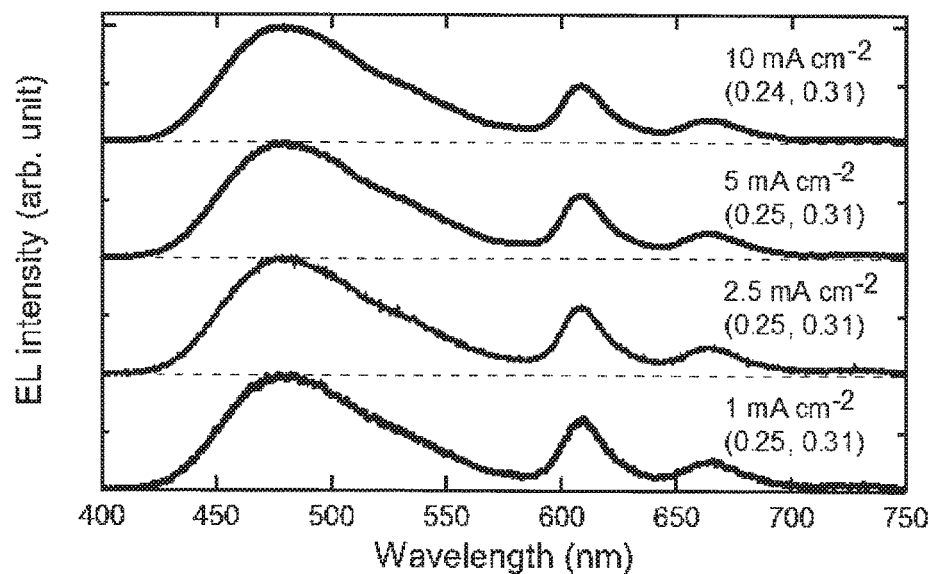
FIG. 3 This is the light emission spectra of the organic electroluminescent device produced in Example 1.
Figure 4:
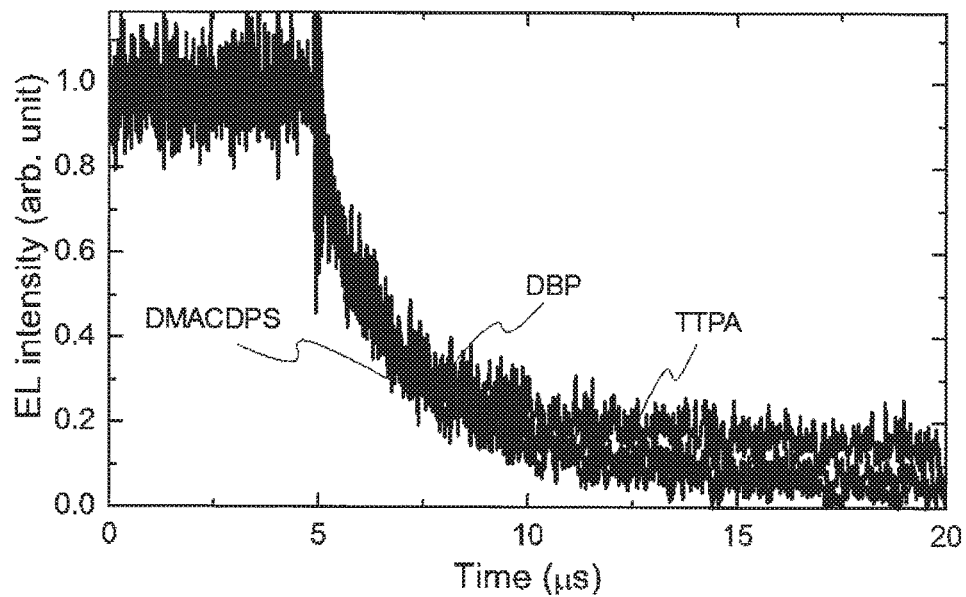
FIG. 4 This is the transient decay curves of the organic electroluminescent device produced in Example 1.
Figure 6:
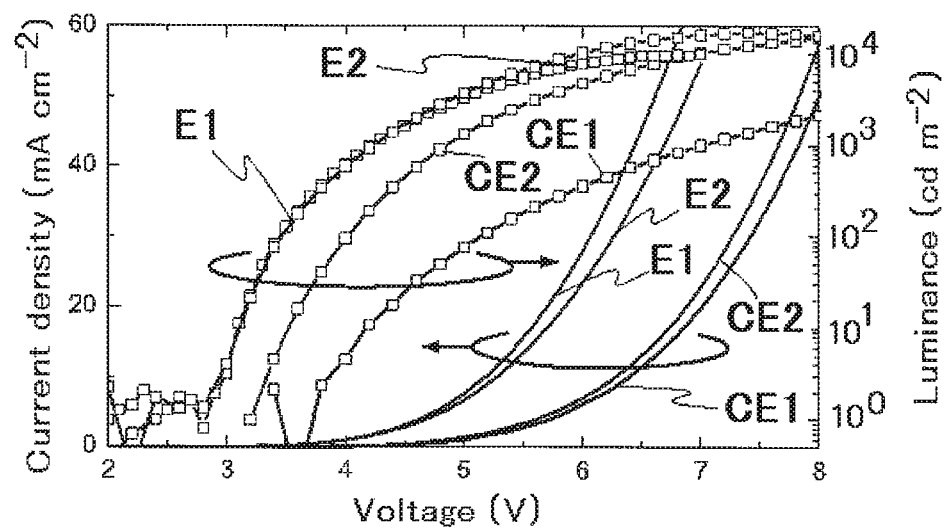
FIG. 6 This is graphs showing the voltage-current density-emission intensity characteristics of the organic electroluminescent devices produced in Example 1 and Example 2 and Comparative Examples 1 and 2.
Figure 7:
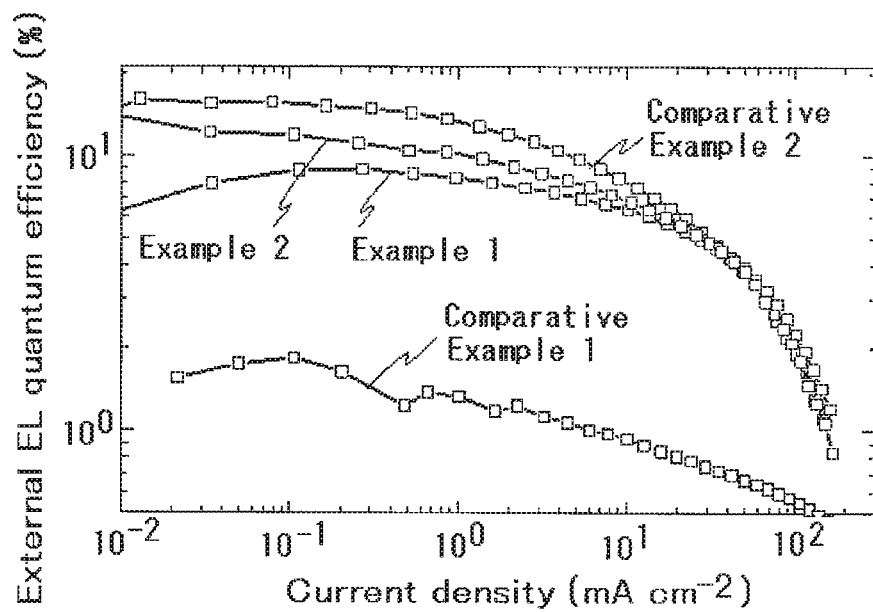
FIG. 7 This is graphs showing the current density-external quantum efficiency characteristics of the organic electroluminescent devices produced in Example 1 and Example 2. and Comparative Examples 1 and 2.

FIG. 3 shows emission spectra at a different current density of 1 mA/cm$^2$, 2.5 mA/cm$^2$, 5 mA/cm$^2$, or 10 mA/cm$^2$ of the produced organic electroluminescent device, and FIG. 4 shows transient emission decay curves corresponding to the emission wavelengths of DMACDPS, TTPA and DBP; FIG. 6 shows voltage-current density-emission intensity characteristics; and FIG. 7 shows current density-external quantum efficiency characteristics. In FIG. 3, the parenthesized numerical data represent CIE chromaticity coordinates. The measured device characteristics are shown in Table 1.

The produced organic electroluminescent device realized a high external quantum efficiency of 12.1%.

FIG. 3 confirms that the organic electroluminescent device gives emission spectra of the same pattern irrespective of current density. In addition, as shown in FIG. 4, the light (blue) corresponding to the emission wavelength of DMACDPS, the light (green) corresponding the emission wavelength of TTPA, and the light (red) corresponding to the emission wavelength of DBP were all radiated as delayed fluorescence, and the emission decay patterns were almost the same between these. This confirms that the energy caused by reverse intersystem crossing of DMACDPS transferred to TTPA and DBP to give green emission and red emission.

Example 2

Production and Evaluation of Another Organic Electroluminescent Device Having Green/Red Fluorescent Material-Containing Layer (DBP, TTPA)/mCP Spacer Layer/Delayed Blue Fluorescent Material-Containing Layer (DMACDPS)

An organic electroluminescent device was produced in the same manner as in Example 1, except that the TTPA concentration in the green/red fluorescent material-containing layer was changed to 15% by weight.

Figure 5:
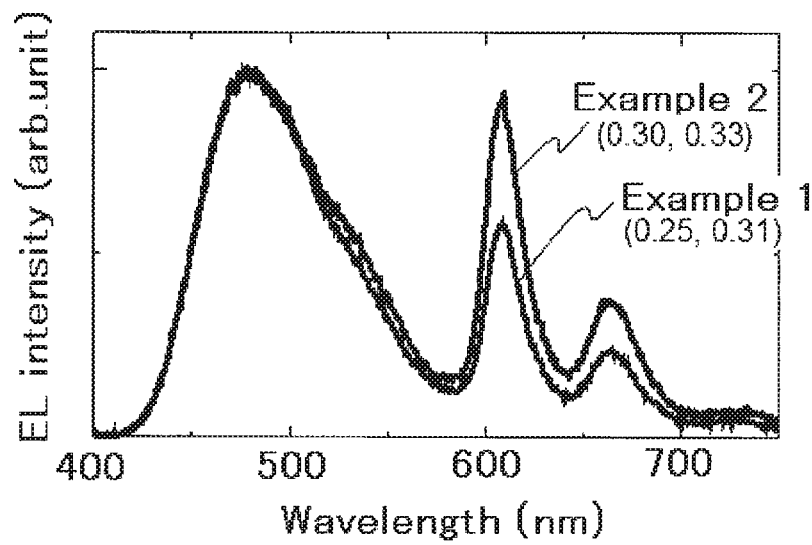
FIG. 5 This is the light emission spectra of the organic electroluminescent devices produced in Example 1 and Example 2.

FIG. 5 shows the emission spectra at 1 mA/cm$^2$ of the produced organic electroluminescent devices; FIG. 6 shows voltage-current density-emission intensity characteristics; and FIG. 7 shows current density-external quantum efficiency characteristics. In FIG. 5, the parenthesized numerical data represent CIE chromaticity coordinates. The measured device characteristics are shown in Table 1.

The produced organic electroluminescent device realized a high external quantum efficiency of 8.92%.

Example 3

Production and Evaluation of Another Organic Electroluminescent Device Having Green/Red Fluorescent Material-Containing Layer (DBP, TTPA)/mCP Spacer Layer/Delayed Blue Fluorescent Material-Containing Layer (DMACDPS)

An organic electroluminescent device was produced in the same manner as in Example 1, except that the thickness of the spacer layer was changed to 1 nm. The device characteristics of the produced organic electroluminescent device are shown in Table 1.

The organic electroluminescent device realized a high external quantum efficiency of 8.8%.

Comparative Example 1

Production and Evaluation of Organic Electroluminescent Device Having Layer of DBP, TTPA and DMACDPS as Mixture An organic electroluminescent device was produced in the same manner as in Example 1, except that a layer having a thickness of 7.5 nm was formed by co-deposition of DBP, TTPA and DMACDPS from different vapor deposition sources in place of forming green/red fluorescent material-containing layer/mCP spacer layer/delayed blue fluorescent material-containing layer. At this time, the DBP concentration was 1% by weight, and the TTPA concentration was 10% by weight.

FIG. 6 shows voltage-current density-emission intensity characteristics of the Produced organic electroluminescent device; and FIG. 7 shows current density-external quantum efficiency characteristics. The measured device characteristics are shown in Table 1.

The produced organic electroluminescent device had a low external quantum efficiency of 1.84% and, in addition, the emission color from the device was reddish and the whiteness thereof was low.

Comparative Example 2

Production and Evaluation of Organic Electroluminescent Device Having Delayed Blue Fluorescent Material-Containing Layer (DMACDPS)

An organic electroluminescent device was produced in the same manner as in Example 1, except that the green/red fluorescent material-containing layer and the spacer layer were not formed.

FIG. 6 shows voltage-current density-emission intensity characteristics of the produced organic electroluminescent device; and FIG. 7 shows current density-external quantum efficiency characteristics. The measured device characteristics are shown in Table 1.

From the organic electroluminescent device, DMACDPS-derived blue emission alone was observed.

Comparative Example 3

Production and Evaluation of Organic Electroluminescent Device Having Green/Red Fluorescent Material-Containing Layer (DBP,TTPA)/Delayed Blue Fluorescent Material-Containing Layer (DMACDPS)

An organic electroluminescent device was produced in the same manner as in Example 1, except that the spacer layer was not followed. The device characteristics of the produced organic electroluminescent device are shown in Table 1.

The maximum external quantum efficiency of the organic electroluminescent device was 6.3% and was low.

TABLE 1

| | Turn-on Voltage (V) | Maximum External Quantum Efficiency Max$\eta_{EQE}$ (%) | Maximum Power Efficiency MaxPE (lmW$^{-1}$) | CIE | Device Characteristics at 1000 cdm$^{-2}$ | | |
|---|---|---|---|---|---|---|---|
| | | | | | Voltage (V) | External Quantum Efficiency $\eta_{EQE}$ (%) | Power Efficiency PE (lmW$^{-1}$) |
| Example 1 | 3.0 | 12.1 | 22.0 | (0.25, 0.31) | 5.2 | 7.2 | 8.1 |
| Example 2 | 3.0 | 8.92 | 15.1 | (0.31, 0.32) | 5.2 | 6.4 | 7.0 |
| Example 3 | 3.0 | 8.8 | 13.2 | (0.25, 0.30) | 4.8 | 6.2 | 7.0 |
| Comparative Example 1 | 4.0 | 1.84 | 2.25 | (0.62, 0.34) | 9.2 | 0.5 | 0.3 |
| Comparative Example 2 | 3.4 | 16.0 | 27.4 | (0.19, 0.29) | 5.8 | 9.7 | 9.9 |
| Comparative Example 3 | 3.0 | 6.3 | 10.0 | (0.26, 0.29) | 5.0 | 4.6 | 4.9 |

<Delayed Blue Fluorescent Material>

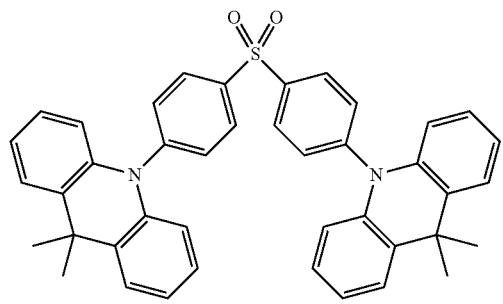

DMACDPS

<Green Fluorescent Material>

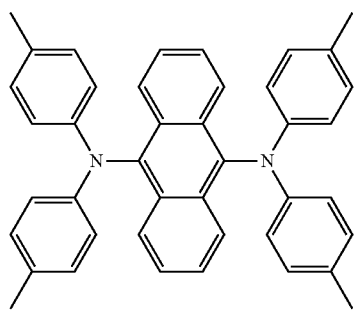

TTPA

<Red Fluorescent Material>

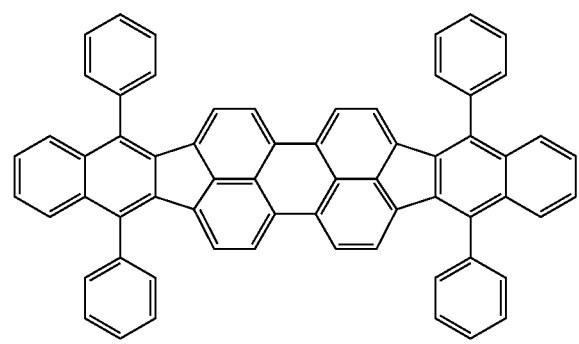

DBP

-continued

<Other Materials>

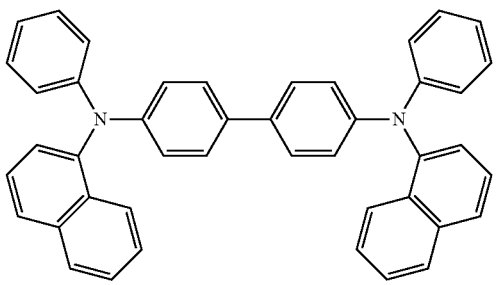

α-NPD

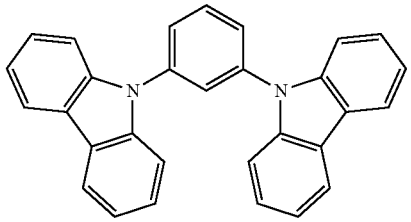

mCP

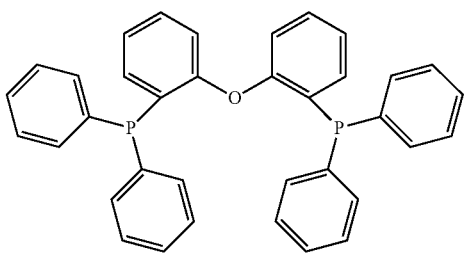

DPEPO

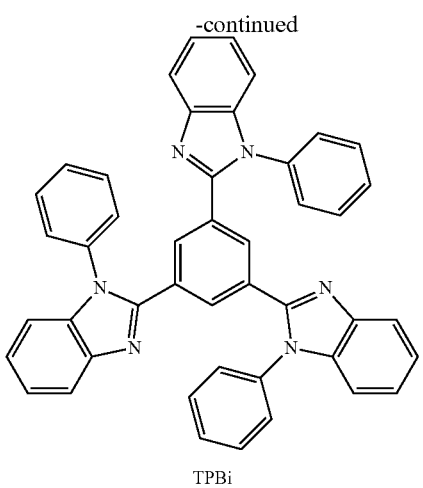

TPBi

The lowest excited singlet energy level of DMACDPS is 3.0 eV, the lowest excited triplet energy level thereof is 2.98 eV, the lowest excited singlet energy level of TTPA is 2.34 eV, and the lowest excited singlet energy level of DBP is 2.03 eV.

INDUSTRIAL APPLICABILITY

The organic light-emitting device of the present invention can efficiently emit white color, and can be therefore effectively used as a white emitting diode that is much in demand in the art. Consequently, the industrial applicability of the present invention is high.

REFERENCE SIGNS LIST

1 Substrate
2 Anode
3 Hole Injection Layer
4 Hole Transport Layer
5 Light-Emitting Layer
6 Electron Transport Layer
7 Cathode
10 Delayed Blue Fluorescent Material-Containing Layer (layer containing delayed blue fluorescent material)
11 Green/Red Fluorescent Material-Containing Layer (layer containing separately or together green fluorescent material and red fluorescent material)
12 Spacer Layer

The invention claimed is:

1. An organic light-emitting device having a layer containing a delayed blue fluorescent material, a layer containing separately or together a green fluorescent material and a red fluorescent material, and a spacer layer arranged between the layer containing a delayed blue fluorescent material and the layer containing separately or together a green fluorescent material and a red fluorescent material.

2. The organic light-emitting device according to claim 1, wherein the layer containing a delayed blue fluorescent material further contains a host material.

3. The organic light-emitting device according to claim 1, wherein in the layer containing separately or together a green fluorescent material and a red fluorescent material, the green fluorescent material and the red fluorescent material exist in one and the same layer as mixed therein.

4. The organic light-emitting device according to claim 1, wherein in the layer containing separately or together a green fluorescent material and a red fluorescent material, the green fluorescent material and the red fluorescent material are contained separately in different layers.

5. The organic light-emitting device according to claim 4, wherein the layer containing a green fluorescent material and the layer containing a red fluorescent material are arranged continuously.

6. The organic light-emitting device according to claim 4, wherein the layer containing a green fluorescent material is arranged closer to the side of the spacer layer than to the side of the layer containing a red fluorescent material.

7. The organic light-emitting device according to claim 1, wherein regarding the weight of each fluorescent material in the layer containing separately or together a green fluorescent material and a red fluorescent material, the weight of the green fluorescent material is larger than that of the red fluorescent material.

8. The organic light-emitting device according to claim 7, wherein in the layer containing separately or together a green fluorescent material and a red fluorescent material, the molar ratio of the red fluorescent material to the green fluorescent material (weight of red fluorescent material/weight of green fluorescent material) is ½ to ¹⁄₁₀₀.

9. The organic light-emitting device according to claim 1, wherein the layer containing separately or together a green fluorescent material and a red fluorescent material further contains a host material.

10. The organic light-emitting device according to claim 1, wherein the thickness of the spacer layer is 0.5 to 10 nm.

11. The organic light-emitting device according to claim 1, wherein the lowest excited singlet energy level and the lowest excited triplet energy level of the material of the spacer layer each are larger than the lowest excited singlet energy level and the lowest excited triplet energy level, respectively, of the delayed blue fluorescent material.

12. The organic light-emitting device according to claim 9, wherein the spacer layer contains the same host material as the host material contained in the layer containing separately or together a green fluorescent material and a red fluorescent material.

13. The organic light-emitting device according to claim 1, which is an organic electroluminescent device.

14. The organic light-emitting device according to claim 13, which has an anode, a cathode and, as arranged between the anode and the cathode, an organic layer containing a light-emitting layer, and wherein:
the light-emitting layer has a layer containing a delayed blue fluorescent material, a layer containing separately or together a green fluorescent material and a red fluorescent material, and a spacer layer arranged between the layer containing a delayed blue fluorescent material and the layer containing separately or together a green fluorescent material and a red fluorescent material.

15. The organic light-emitting device according to claim 14, wherein the layer containing a delayed blue fluorescent material is arranged on the cathode side and the layer containing separately or together a green fluorescent material and a red fluorescent material is arranged on the anode side.

* * * * *